US012560961B2

(12) United States Patent
Jung et al.

(10) Patent No.: US 12,560,961 B2
(45) Date of Patent: Feb. 24, 2026

---

(54) HEAT DISSIPATION STRUCTURE AND ELECTRONIC DEVICE INCLUDING THE SAME

(71) Applicant: SAMSUNG ELECTRONICS CO., LTD., Suwon-si (KR)

(72) Inventors: Hyeran Jung, Suwon-si (KR); Seunghoon Kang, Suwon-si (KR); Hongki Moon, Suwon-si (KR); Jongkil Park, Suwon-si (KR); Seungjoo Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 579 days.

(21) Appl. No.: 18/083,322

(22) Filed: Dec. 16, 2022

(65) Prior Publication Data

US 2023/0195167 A1 Jun. 22, 2023

Related U.S. Application Data

(63) Continuation of application No. PCT/KR2022/020598, filed on Dec. 16, 2022.

(30) Foreign Application Priority Data

Dec. 16, 2021 (KR) ........................ 10-2021-0180268
Feb. 18, 2022 (KR) ........................ 10-2022-0021698

(51) Int. Cl.
*G06F 1/16* (2006.01)
*G06F 1/20* (2006.01)
*H05K 7/20* (2006.01)

(52) U.S. Cl.
CPC .......... *G06F 1/1624* (2013.01); *G06F 1/1652* (2013.01); *G06F 1/20* (2013.01); *H05K 7/20963* (2013.01)

(58) Field of Classification Search
CPC .... G06F 1/1624; G06F 1/1641; G06F 1/1652; G06F 1/1681; G06F 1/20; G06F 1/203; H04M 1/02; H05K 7/20; H05K 7/20963
See application file for complete search history.

(56) References Cited

U.S. PATENT DOCUMENTS

| | | | |
|---|---|---|---|
| 12,253,885 B2 * | 3/2025 | Kim ...................... | G06F 1/1624 |
| 2017/0118866 A1 | 4/2017 | Seo et al. | |

(Continued)

FOREIGN PATENT DOCUMENTS

| | | |
|---|---|---|
| CN | 108130005 A | 6/2018 |
| CN | 113329590 A | 8/2021 |

(Continued)

OTHER PUBLICATIONS

International Search Report and Written Opinion for International Application No. PCT/KR2022/020598; International Filing Date Dec. 16, 2022; Date of Mailing Apr. 3, 2023; 9 Pages,.

*Primary Examiner* — Nader Bolourchi
(74) *Attorney, Agent, or Firm* — CANTOR COLBURN LLP

(57) ABSTRACT

According to various embodiments of the disclosure, an electronic device may comprise a housing including a first housing and a second housing for guiding a sliding movement of the first housing, a display having at least a portion configured to be unfolded based on the sliding movement of the first housing and including a first display area disposed on the first housing and a second display area extending from the first display area, an electrical component disposed in the housing, a heat dissipation sheet configured to receive heat generated from the electrical component and including a bending area facing the first display area and a fixed area facing the second display area, and a slit structure formed in at least a portion of the bending area and including at least (Continued)

a portion extending along a first direction inclined from a direction of the sliding movement of the first housing.

20 Claims, 19 Drawing Sheets

(56)                        References Cited

U.S. PATENT DOCUMENTS

| | | |
|---|---|---|
| 2018/0014417 A1 | 1/2018 | Seo et al. |
| 2018/0103552 A1 | 4/2018 | Seo et al. |
| 2019/0312092 A1 | 10/2019 | Kimura et al. |
| 2020/0205301 A1 | 6/2020 | Song |
| 2020/0356143 A1 | 11/2020 | Oh et al. |
| 2020/0375046 A1 | 11/2020 | Sim et al. |
| 2021/0141419 A1 | 5/2021 | Wang et al. |
| 2022/0166082 A1 | 5/2022 | Wang et al. |
| 2022/0253103 A1 | 8/2022 | Choi et al. |
| 2022/0379576 A1 * | 12/2022 | Corrigan .............. B31D 3/0207 |
| 2023/0072326 A1 | 3/2023 | Li et al. |

FOREIGN PATENT DOCUMENTS

| | | | |
|---|---|---|---|
| EP | 4141611 A1 * | 3/2023 | ........... G06F 1/1652 |
| KR | 20180006533 A | 1/2018 | |
| KR | 20200027760 A | 3/2020 | |
| KR | 20200076103 A | 6/2020 | |
| KR | 20210060014 A | 5/2021 | |
| WO | 2021015310 A1 | 1/2021 | |
| WO | 2021130660 A1 | 7/2021 | |
| WO | 2021151473 A1 | 8/2021 | |
| WO | 2021238450 A1 | 12/2021 | |

* cited by examiner

400

420     440                     410

B1          B2

400

420                     410

440

420'

B1          B2

1400

1500

1520    1540    1510

C1    C2    C3

1500    1540

1520    1510

1520'

C2    C3    C1

HEAT DISSIPATION STRUCTURE AND ELECTRONIC DEVICE INCLUDING THE SAME

CROSS-REFERENCE TO RELATED APPLICATION

This application is a continuation of International Application No. PCT/KR2022/020598, designating the United States, filed on Dec. 16, 2022, in the Korean Intellectual Property Receiving Office and claiming priority to Korean Patent Application No. 10-2021-0180268, filed on Dec. 16, 2021 in the Korean Intellectual Property Office and Korean Patent Application No. 10-2022-0021698, filed on Feb. 18, 2022 in the Korean Intellectual Property Office, the disclosures of which are incorporated by reference herein in their entireties.

TECHNICAL FIELD

Various embodiments of the disclosure relate to an electronic device, e.g., a heat dissipation structure and an electronic device including the same.

BACKGROUND ART

Advancing information, communication, and semiconductor technologies accelerate the spread and use of various electronic devices. In particular, recent electronic devices are being developed to carry out a variety of communication tasks while being carried by a user of the respective electronic device.

The term "electronic device" may mean a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as voices or images. As electronic devices are highly integrated, and high-speed, high-volume wireless communication becomes commonplace, an electronic device, such as a mobile communication terminal, is recently being equipped with various functions. For example, an electronic device can be preinstalled with various integrated functionalities, including an entertainment function, such as playing video games, a multimedia function, such as replaying music/videos, a communication and security function for mobile banking, and a scheduling or e-wallet function. Such electronic devices have become compact enough for users to carry in a convenient way.

As mobile communication services extend up to multimedia service sectors, the display of the electronic device may be increased to allow the user to satisfactory use multimedia services as well as voice call or text messaging services.

Technical Problem

An electronic device (e.g., a portable terminal) includes a display with a flat surface or both a flat and curved surface. An electronic device including a display may have a limitation in realizing a screen larger than the size of the electronic device due to the fixed display structure. Accordingly, research has been conducted on electronic devices including a rollable display or flexible display.

An electronic device with a rollable display or a flexible display may have its partial area extended or shrunken when slid or folded.

Electronic devices typically include a heat dissipation sheet to diffuse the heat generated from the included electrical components. A need for a resizable heat dissipation sheet is increasing for electronic devices with a rollable display or flexible display. In an electronic device with a rollable display or flexible display, at least a portion of the heat dissipation member (or heat dissipation sheet) is folded or bent along with the electronic device and/or the display. The heat dissipation member is often a highly conductive material, such as metal, that that can permanently deform when subjected to repeated rolling or folding motions. Accordingly, there is increasing need for a heat dissipation member (or heat dissipation sheet) that provides flexibility and/or extendibility in the folding or bending portion.

Technical Solution

According to various embodiments of the disclosure, there may be provided a heat dissipation structure which may be extended or shrunken and an electronic device including the same.

According to various embodiments of the disclosure, there may be provided a heat dissipation structure which provides flexibility and/or extendibility in a portion bending or folding along with a display of the electronic device and an electronic device including the same.

The disclosure is not limited to the foregoing embodiments but various modifications or changes may rather be made thereto without departing from the spirit and scope of the disclosure.

According to various embodiments of the disclosure, an electronic device may comprise a housing including a first housing and a second housing for guiding a sliding movement of the first housing, a display having at least a portion configured to be unfolded based on the sliding movement of the first housing and including a first display area disposed on the first housing and a second display area extending from the first display area, an electrical component disposed in the housing, a heat dissipation sheet configured to receive heat generated from the electrical component and including a bending area facing the first display area and a fixed area facing the second display area, and a slit structure formed in at least a portion of the bending area and including at least a portion extending along a first direction inclined from a direction of the sliding movement of the housing.

According to various embodiments of the disclosure, an electronic device may comprise a housing including a first housing and a second housing providing a motion relative to the first housing, a hinge structure connecting the first housing and the second housing to pivot from a folded state to an unfolded state, a flexible display formed to be transformed in response to the motion of the first housing relative to the second housing and including a first display area disposed on the first housing, a second display area disposed on the second housing, and a folding area connecting the first display area and the second display area, an electrical component disposed in the housing, a heat dissipation sheet configured to receive heat generated from the electrical component and including a first fixed area facing the first display area, a second fixed area facing the second display area, and a bending area facing the folding area, and a slit structure formed in at least a portion of the bending area and including at least a portion extending along a first direction parallel to, or forming an acute angle with, the folding area.

Advantageous Effects

According to various embodiments of the disclosure, it is possible to secure durability of a heat dissipation sheet through a slit structure for supplementing (or receiving) the extension or contraction of the heat dissipation sheet.

According to various embodiments of the disclosure, as the heat generated from the electrical components is diffused through the heat dissipation sheet, heat concentration on a portion of the display may be prevented, so that user convenience may be increased.

Effects of the disclosure are not limited to the foregoing, and other unmentioned effects would be apparent to one of ordinary skill in the art from the following description.

MODE FOR INVENTION

Figure 1:
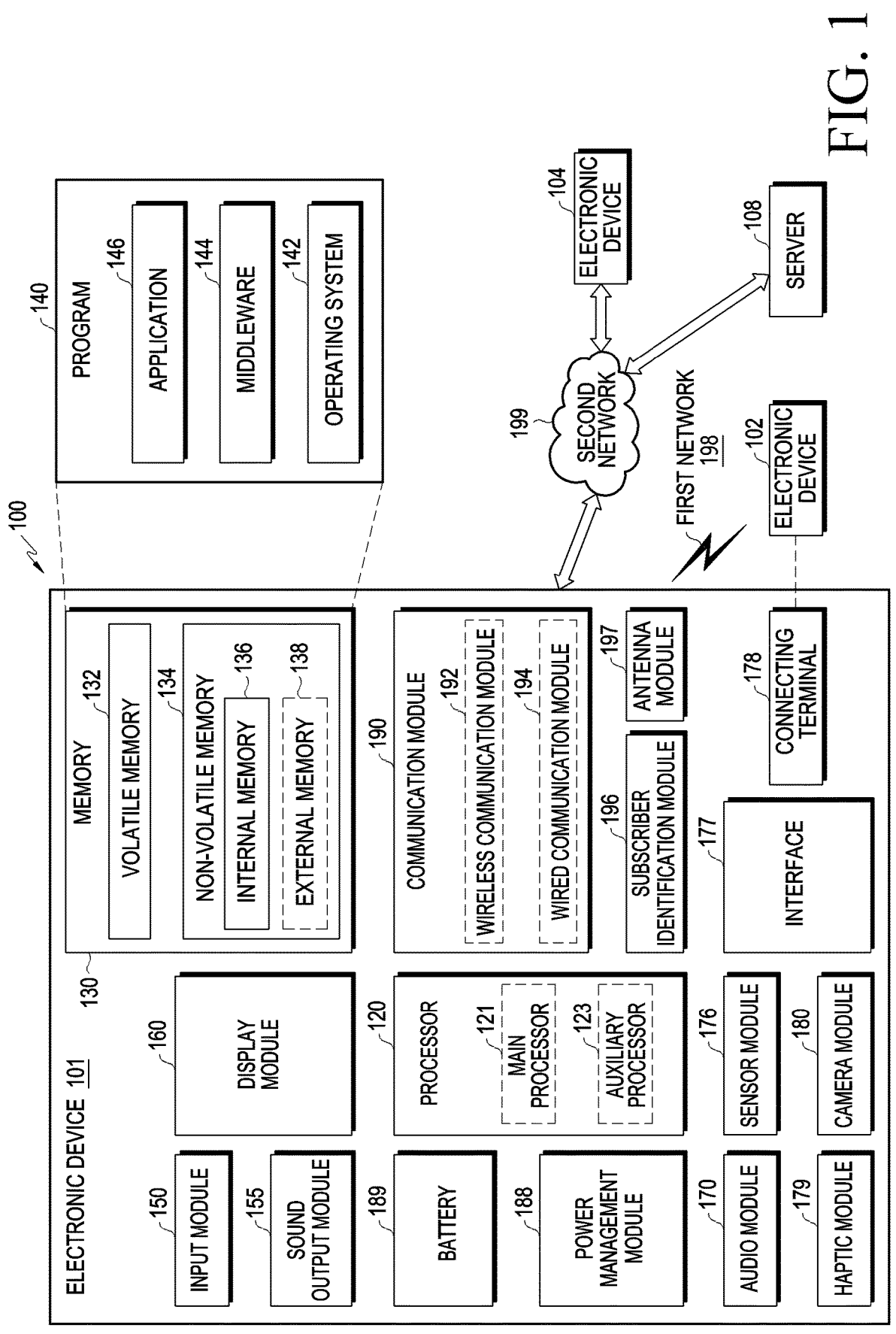
FIG. 1 is a block diagram illustrating an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an accelerometer, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beamforming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
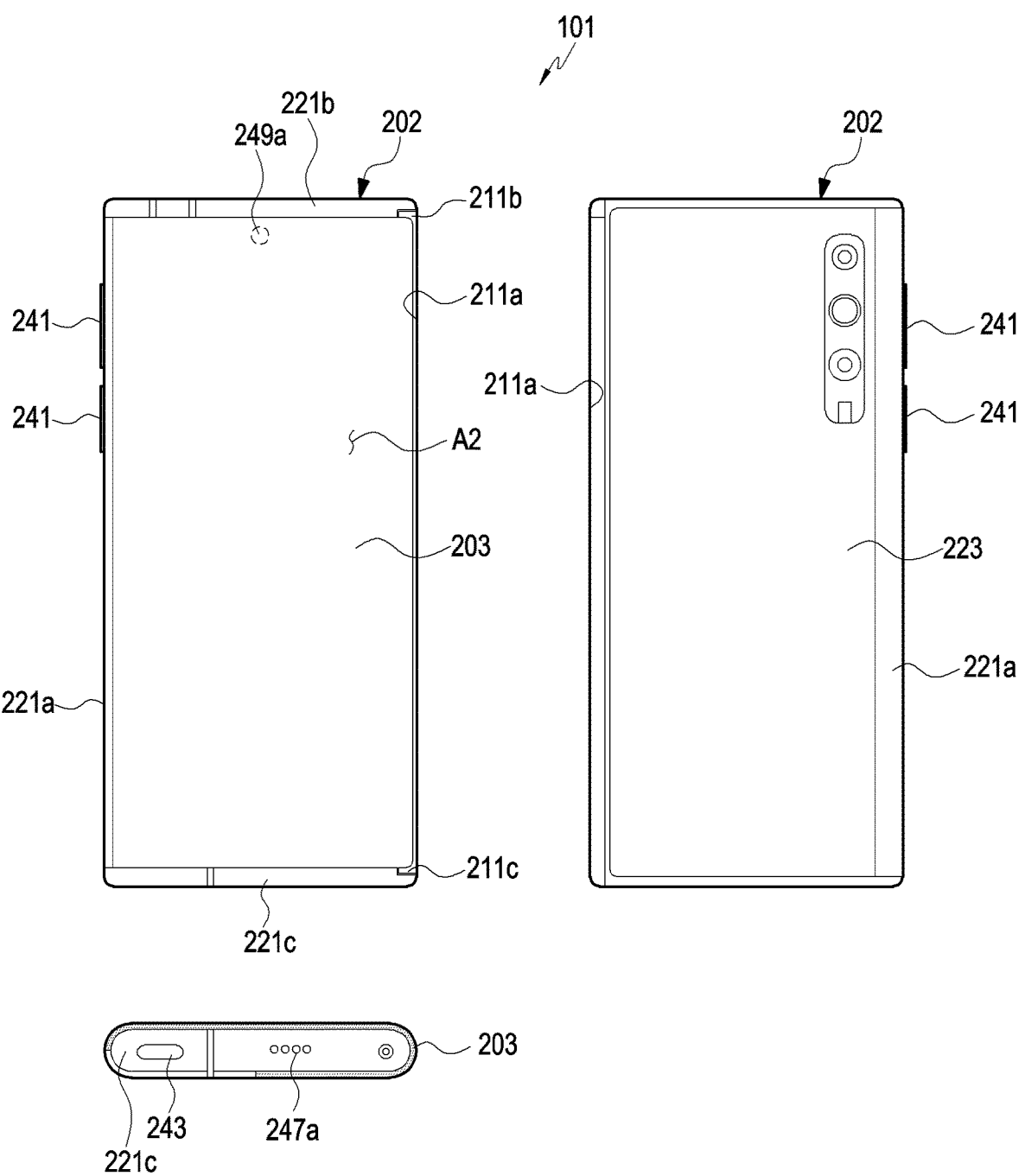
FIG. 2 is a view illustrating an electronic device in a closed state, according to various embodiments of the disclosure.
Figure 3:
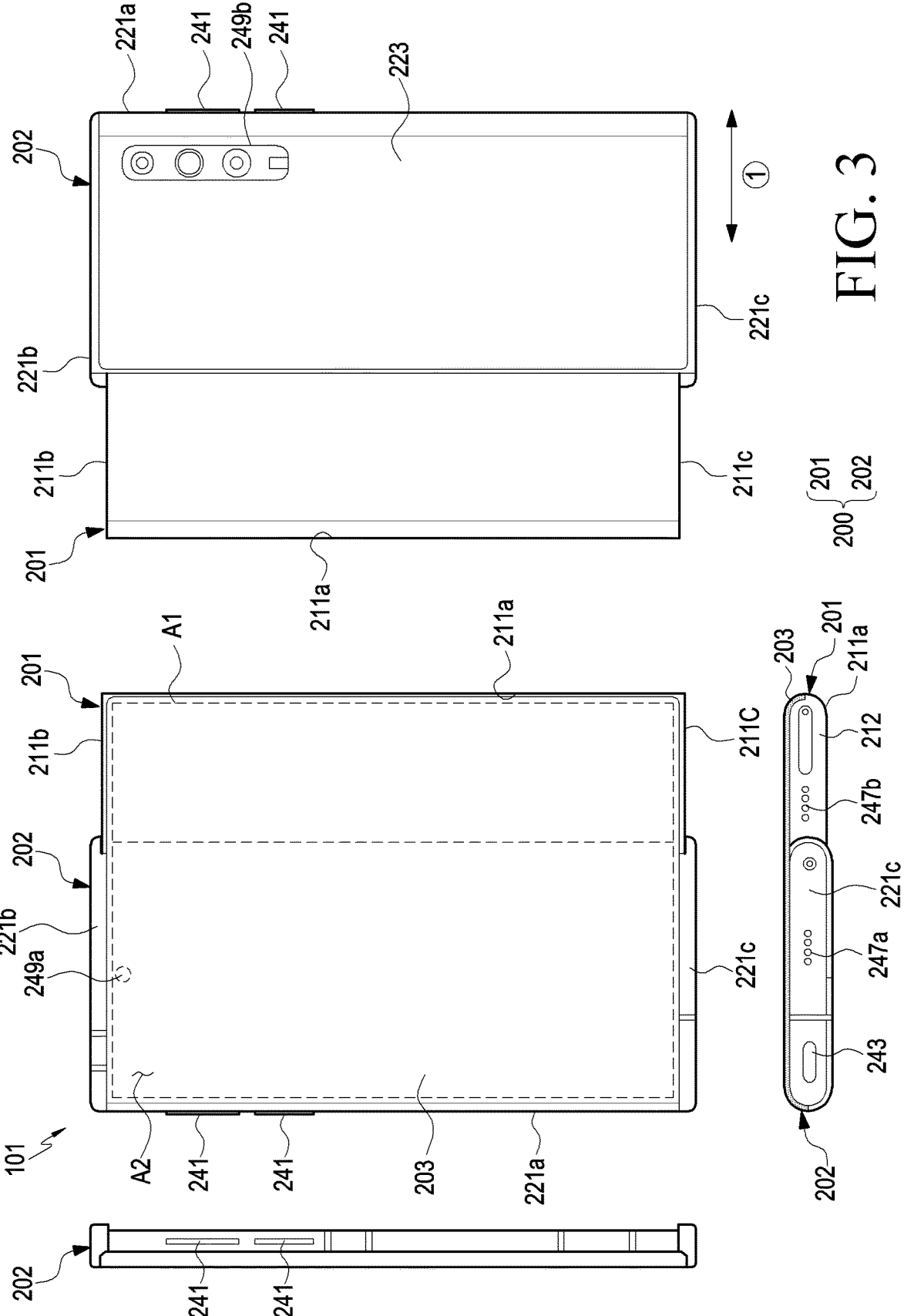
FIG. 3 is a view illustrating an electronic device in an open state, according to various embodiments of the disclosure.

FIG. 2 is a view illustrating an electronic device in a closed state, according to various embodiments of the disclosure. FIG. 3 is a view illustrating an electronic device in an open state, according to various embodiments of the disclosure. For example, FIG. 2 is a view illustrating a state in which a first display area A1 is received in a second housing 202. FIG. 3 is a view illustrating a state in which at least a portion of the first display area A1 is visually exposed to the outside of the second housing 202.

The state shown in FIG. 2 may be denoted as a first housing 201 being closed with respect to a second housing 202, and the state shown in FIG. 2 may be denoted as the first housing 201 being open with respect to the second housing 202. According to an embodiment, the "closed state" or "opened state" may be defined as a closed or open state of the electronic device.

Referring to FIGS. 2 and 3, the electronic device 101 may include a housing 200. According to various embodiments, the housing 200 may include a second housing 202 and a first housing 201 that is movable with respect to the second housing 202. According to an embodiment, the electronic device 101 may be interpreted as having a structure in which the second housing 202 is slidably disposed on the first housing 201. According to an embodiment, the first housing 201 may be disposed to perform reciprocating motion by a predetermined distance in a predetermined direction with respect to the second housing 202, for example, a direction indicated by an arrow ① (refer to FIG. 3). The configuration of the electronic device 101 of FIGS. 2 and 3 may be identical in whole or part to the configuration of the electronic device 101 of FIG. 1.

According to an embodiment, the first housing 201 may be referred to as, e.g., a first structure, a slide part, or a slide housing, and may be disposed to reciprocate on the second housing 202. According to an embodiment, the second housing 202 may be referred to as, e.g., a second structure, a main part, or a main housing. According to an embodiment, the second housing 202 may receive at least a portion of the first housing 201 and may guide a sliding movement of the first housing 201. According to an embodiment, the second housing 202 may receive various electrical/electronic components, such as a main circuit board or a battery. According to an embodiment, at least a portion (e.g., the second display area A2) of the display 203 may be visually exposed to the outside of the housing 200. According to an embodiment, when the first housing 201 moves in a first slide direction (e.g., the –X direction of FIG. 4) with respect to the second housing 202 (e.g., a closing motion), another portion (e.g., the first display area A1) of the display 203 may be received in the first housing 201, and the first housing 201 in which the other portion (e.g., the first display area A1) of the display 203 is received may be received in the second housing 202 (e.g., slide-in motion). According to an embodiment, when the first housing 201 moves in a second slide direction (e.g., the +X direction of FIG. 4) with respect to the second housing 202 (e.g., an opening motion), the first housing 201 may be exposed or drawn out from the inside of the second housing 202 to the outside of the second housing 202 (e.g., slide-out motion), and the other portion (e.g., the first display area A1) of the display 203 may be visually exposed from the inside of the first housing 201 to the outside of the first housing 201. According to an embodiment, a motor, a speaker, a sim socket, and/or a sub circuit board electrically connected with a main circuit board may be disposed in the first housing 201. A main circuit board on which electrical components, such as an application processor (AP) and a communication processor (CP) are mounted may be disposed in the second housing 202.

According to various embodiments, the first housing 201 may include a first plate (e.g., the first plate 211 of FIG. 4) (e.g., a slide plate). According to an embodiment, the first plate 211 may support at least a portion of the display 203 (e.g., the second display area A2). According to an embodiment, the first plate 211 may include first sidewalls 211a, 211b, and 211c for surrounding at least a portion of the display 203 and/or the multi-bar structure (e.g., the multi-bar structure 213 of FIG. 4). According to an embodiment, the first sidewalls 211a, 211b, and 211c may extend from the first plate 211. According to an embodiment, the first sidewalls 211a, 211b, and 211c may include a 1-2th sidewall 211b, a 1-3th sidewall 211c opposite to the 1-2th sidewall 211b, and a 1-1th sidewall 211a extending from the 1-2th sidewall 211b to the 1-3th sidewall 211c. According to an embodiment, the 1-1th sidewall 211a may be substantially perpendicular to the 1-2th sidewall 211b and/or the 1-3th sidewall 211c. According to an embodiment, in the closed state (e.g., FIG. 2) of the electronic device 101, the 1-2th sidewall 211b may face the 2-2th sidewall 221b of the second housing 202, and the 1-3th sidewall 211c may face the 2-3th sidewall 221c of the second housing 202. According to an embodiment, the first plate 211, the 1-1th sidewall 211a, the 1-2th sidewall 211b, and/or the 1-3th sidewall 211c may be integrally formed. According to another embodiment, the first plate 211, the 1-1th sidewall 211a, the 1-2th sidewall 211b, and/or the 1-3th sidewall 211c may be formed as separate housings and be combined or assembled.

According to various embodiments, the second housing 202 may include second sidewalls 221a, 221b, and 221c to surround at least a portion of the first housing 201. According to an embodiment, the second sidewalls 221a, 221b, and 221c may extend from a second plate (e.g., the second plate 221 of FIG. 4) and/or a cover member (e.g., the cover member 222 of FIG. 4). According to an embodiment, the second sidewalls 221a, 221b, and 221c may include a 2-2th sidewall 221b, a 2-3th sidewall 221c opposite to the 2-2th sidewall 221b, and a 2-1th sidewall 221a extending from the 2-2th sidewall 221b to the 2-3th sidewall 221c. According to an embodiment, the 2-1th sidewall 221a may be substantially perpendicular to the 2-2th sidewall 221b and/or the 2-3th sidewall 221c. According to an embodiment, the 2-2th sidewall 221b may face the 1-2th sidewall 211b, and the 2-3th sidewall 221c may face the 1-3th sidewall 211c. For example, in the closed state (e.g., FIG. 2) of the electronic device 101, the 2-2th sidewall 221b may cover at least a portion of the 1-2th sidewall 211b, and the 2-3th sidewall 221c may cover at least a portion of the 1-3th sidewall 211c.

According to various embodiments, the second housing 202 may be formed to be open at one side (e.g., a front face) to receive (or surround) at least a portion of the second housing 201. For example, the first housing 201 may be connected to the second housing 202 while being at least partially surrounded by the 2-1th sidewall 221a, the 2-2th sidewall 221b, and the 2-3th sidewall 221c and may be slid in the direction of arrow ⓪ while being guided by the second housing 202. According to an embodiment, the cover member 222 (e.g., the cover member 222 of FIG. 4), the 2-1th sidewall 221a, the 2-2th sidewall 221b, and/or the 2-3th sidewall 221c may be formed integrally. According to another embodiment, the second cover member 222, the 2-1th sidewall 221a, the 2-2th sidewall 221b, and/or the 2-3th sidewall 221c may be formed as separate housings and be combined or assembled.

According to various embodiments, the second housing 202 may include a rear plate 223. According to an embodiment, the rear plate 223 may form at least a portion of the exterior of the electronic device 101. For example, the rear plate 223 may provide a decorative effect on the exterior of the electronic device 101.

According to various embodiments, the cover member 222 and/or the 2-1th sidewall 221a may cover at least a portion of the display 203. For example, at least a portion (e.g., the first display area A1) of the display 203 may be received in the second housing 202, and the cover member 222 and/or the 2-1th side wall 221a may cover a portion of the display 203 received in the second housing 202.

According to various embodiments, the electronic device 101 may include a display 203. For example, the display 203 may be interpreted as a flexible display or a rollable display. According to an embodiment, at least a portion (e.g., the first display area A1) of the display 203 may slide based on the slide of the first housing 201. According to an embodiment, the display 203 may include, or be disposed adjacent to, a touch detection circuit, a pressure sensor capable of measuring the intensity (pressure) of a touch, and/or a digitizer that detects a magnetic field-type stylus pen. The configuration of the display 203 of FIGS. 2 and 3 may be identical in whole or part to the configuration of the display module 160 of FIG. 1.

According to various embodiments, the display 203 may include a first display area A1 and a second display area A2. According to an embodiment, the second display area A2 may be an area that is always visible from the outside. According to an embodiment, the second display area A2 may be interpreted as an area that cannot be positioned inside the second housing 202. According to an embodiment, the first display area A1 may extend from the second display area A2, and the first display area A1 may be inserted or received in, or visually exposed to the outside of, the second housing 202 as the first housing 201 slides. According to an embodiment, the second display area A2 may be seated on a portion (e.g., the first plate 211) of the first housing 201.

According to various embodiments, the first display area A1 may be moved to be received in the first housing 201 while being guided by the multi-bar structure (e.g., the multi-bar structure 213 of FIG. 4) substantially mounted in the first housing 201, and the first display area A1 received in the first housing 201, along with the first housing 201, may be received in the second housing 202. Further, the first display area A1 may be moved to be visually exposed from the inside of the first housing 201 to the outside of the first housing 201 while being guided by the multi-bar structure (e.g., the multi-bar structure 213 of FIG. 4), and the first display area A1 exposed to the outside of the first housing 201, along with the first housing 201, may be visually exposed to the outside of the second housing 202. According to an embodiment, the first display area A1 may be moved based on a sliding movement of the first housing 201 in the width direction (e.g., the direction indicated by the arrow ①). For example, at least a portion of the first display area A1 may be unfolded or rolled together with the multi-bar structure 213 based on a slide of the first housing 201.

According to various embodiments, when viewed from above the first housing 201, if the first housing 201 moves from the closed state to the open state, the first display area A1 may be gradually exposed to the outside of the second housing 202 to be substantially coplanar with the second display area A2. In an embodiment, the first display area A1 may be at least partially received in the first housing 201 and/or the second housing 202.

According to various embodiments, the electronic device 101 may include at least one key input device 241, a connector hole 243, audio modules 247a and 247b, or camera modules 249a (also referred to as a first camera module) and 249b (also referred to as a second camera module). Although not shown, the electronic device 101 may further include an indicator (e.g., a light emitting diode (LED) device) or various sensor modules. The configuration of the audio module 247a and 247b and/or camera modules 249a and 249b of FIGS. 2 and/or 3 may be identical in whole or part to the configuration of the audio module 170 and/or the camera module 180 of FIG. 1.

According to various embodiments, the key input device 241 may be positioned in one area of the second housing 202. Depending on the appearance and the state of use, the electronic device 101 may be designed to omit at least one of the illustrated key input devices 241 or to include additional key input device(s). According to an embodiment, the electronic device 101 may include a key input device (not shown), e.g., a home key button or a touchpad disposed around the home key button. According to another embodiment (not shown), at least a portion of the key input device 241 may be disposed on the first housing 201.

According to various embodiments, the connector hole 243 may be omitted or may receive a connector (e.g., a universal serial bus (USB) connector) for transmitting and receiving power and/or data with an external electronic device. Although not shown, the electronic device 101 may include a plurality of connector holes 243, and some of the plurality of connector holes 243 may function as connector holes for transmitting/receiving audio signals with an external electronic device. In the illustrated embodiment, the connector hole 243 is disposed in the 2-3th sidewall 221c but is not limited thereto. The connector hole 243 or a connector hole not shown may be disposed in the 2-1th sidewall 221a or the 2-2th sidewall 221b.

According to various embodiments, the audio modules 247a and 247b may include at least one speaker hole or at least one microphone hole. At least one of the speaker holes 247a and 247b may be provided as an external speaker hole. At least one of the speaker holes 247a and 247b may be provided as a receiver hole for voice call. The electronic device 101 may include a microphone for obtaining sound. The microphone may obtain external sound of the electronic device 100 through the microphone hole. According to an embodiment, the electronic device 101 may include a plurality of microphones to detect the direction of sound. According to an embodiment, the electronic device 101 may include an audio module in which the speaker holes 247a and 247b and the microphone hole are implemented as one hole or may include a speaker without the speaker hole 247a (e.g., a piezo speaker).

According to various embodiments, the camera modules 249a and 249b may include a first camera module 249a and/or a second camera module 249b. The second camera module 249b may be positioned in the second housing 202 and may capture a subject in a direction opposite to the second display area A2 of the display 203. The electronic device 101 may include a plurality of camera modules 249a and 249b. For example, the electronic device 101 may include at least one of a wide-angle camera, a telephoto camera, or a close-up camera. According to an embodiment, the electronic device 101 may measure the distance to the subject by including an infrared projector and/or an infrared receiver. The camera modules 249a and 249b may include one or more lenses, an image sensor, and/or an image signal processor. The electronic device 101 may further include another camera module (first camera module 249a, e.g., a front camera) that captures a subject in a direction opposite to the second camera module 249b. For example, the first camera module 249a may be disposed around the second display area A2 or in an area overlapping the second display area A2. If disposed in an area overlapping the display 203, the first camera module 249a may capture the subject through the display 203.

According to various embodiments, an indicator (e.g., an LED device) of the electronic device 101 may be disposed on the first housing 201 and/or the second housing 202, and the indicator may include a light emitting diode to provide state information about the electronic device 101 as a visual signal. For example, the first camera module 249a may include an under display camera (UDC) that may not be visually exposed to the screen display area (e.g., the first display area A1 or the second display area A2) but hidden. The sensor module (e.g., the sensor module 176 of FIG. 1) of the electronic device 101 may produce an electrical signal or data value corresponding to the internal operation state or external environment state of the electronic device. The sensor module may include, for example, a proximity sensor, a fingerprint sensor, or a biometric sensor (e.g., an iris/face recognition sensor or a heartrate monitor (HRM) sensor). In another embodiment, the electronic device 101 may include at least one of a gesture sensor, a gyro sensor, an atmospheric pressure sensor, a magnetic sensor, an accelerometer, a grip sensor, a color sensor, an infrared (IR)

sensor, a temperature sensor, a humidity sensor, or an illuminance sensor. The configuration of the display 203, audio module 247a and 247b, and camera modules 249a and 249b of FIGS. 2 and 3 may be identical in whole or part to the configuration of the display module 160, the audio module 170, and the camera module 180 of FIG. 1.

Figure 4:
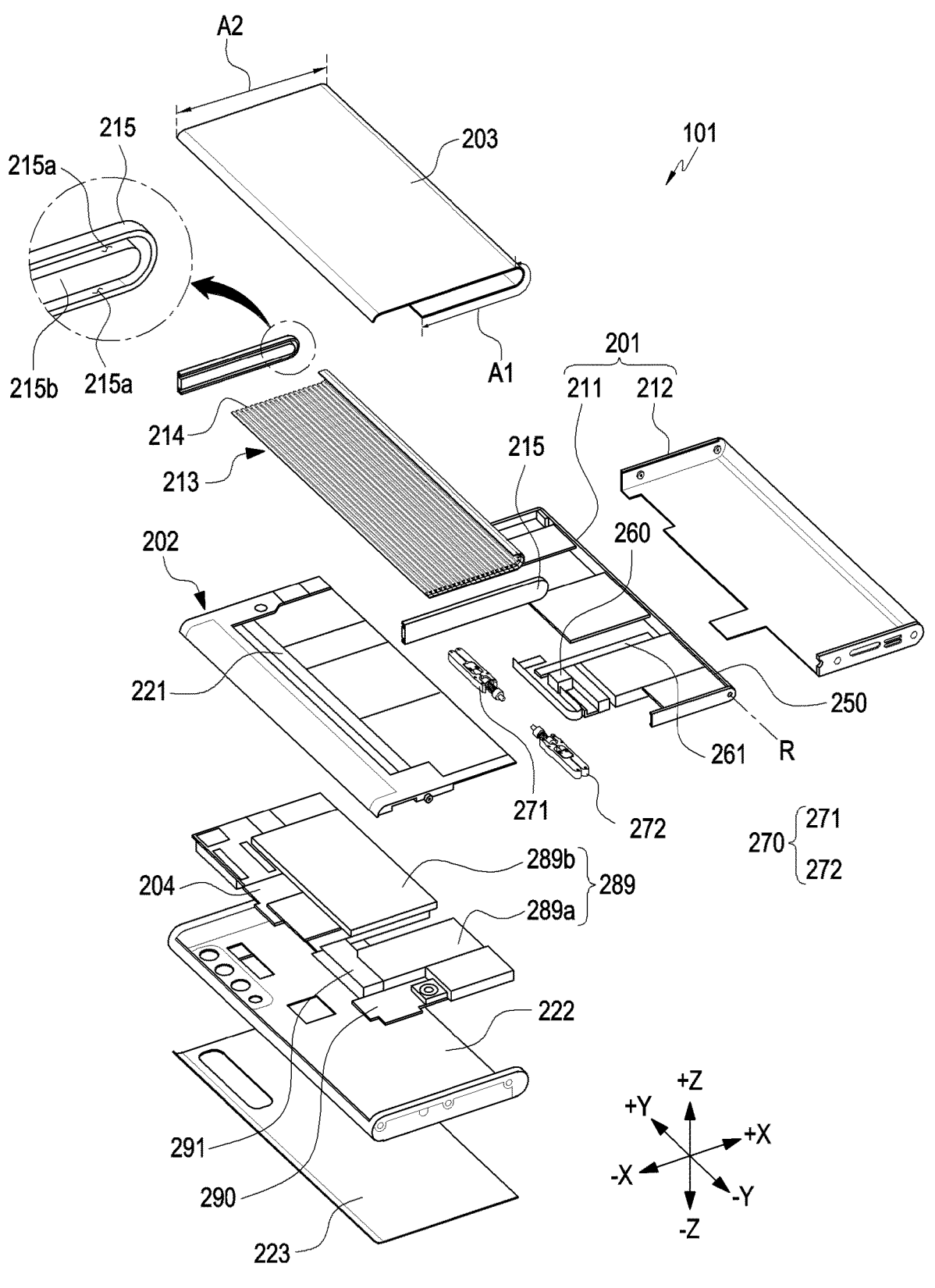
FIG. 4 is an exploded perspective view illustrating an electronic device according to one of various embodiments of the disclosure.

FIG. 4 is an exploded perspective view illustrating an electronic device according to one of various embodiments of the disclosure.

Referring to FIG. 4, an electronic device 101 may include a first housing 201, a second housing 202, a display 203, and/or a multi-bar structure 213. A portion (e.g., the first display area A1) of the display 203 may be received in the electronic device 101 while being guided by the multi-bar structure 213. The configuration of the first housing 201, the second housing 202, and/or the display 203 of FIG. 4 may be identical in whole or part to the configuration of the first housing 201, the second housing 202, and/or the display 203 of FIGS. 2 and 3.

According to various embodiments, the first housing 201 may include a first plate 211 and a slide cover 212. The first plate 211 and the slide cover 212 may linearly reciprocate in one direction (e.g., the direction of arrow ① in FIG. 3) while being guided by the second housing 202. According to an embodiment, the first plate 211, along with the slide cover 212, may slide with respect to the second housing 202. For example, at least a portion of the display 203 and/or at least a portion of the multi-bar structure 213 may be disposed between the first plate 211 and the slide cover 212.

According to an embodiment, the first plate 211 may support at least a portion of the display 203 (e.g., the first display area A1). For example, the first plate 211 may include a curved surface 250. The first display area A1 of the display 203 may be positioned on the curved surface 250. According to an embodiment, the first plate 211 may be interpreted as a display support bar (DSB).

According to an embodiment, the slide cover 212 may protect the display 203 positioned on the first plate 211. For example, at least a portion of the display 203 may be positioned between the first plate 211 and the slide cover 212. According to an embodiment, the first plate 211 and the slide cover 212 may be formed of a metal material and/or a non-metal (e.g., polymer) material.

According to various embodiments, the first housing 201 may include a guide rail 215. According to an embodiment, the guide rail 215 may be connected to the first plate 211 and/or the slide cover 212. For example, the guide rail 215, along with the first plate 211 and the slide cover 212, may slide with respect to the second housing 202.

According to various embodiments, the electronic device 101 may include a multi-bar structure 213. According to an embodiment, the multi-bar structure 213 may support the display 203. For example, the multi-bar structure 213 may be connected with the display 203. According to an embodiment, at least a portion of the display 203 and the multi-bar structure 213 may be positioned between the first plate 211 and the slide cover 212. According to an embodiment, as the first housing 201 slides, the multi-bar structure 213 may move with respect to the second housing 202. In the closed state (e.g., FIG. 2) of the multi-bar structure 213, most of the structure may be received in the second housing 202. According to an embodiment, at least a portion of the multi-bar structure 213 may move corresponding to the curved surface 250 positioned at the edge of the first plate 211.

According to various embodiments, the multi-bar structure 213 may include a plurality of rods 214 (or bars). The plurality of rods 214 may extend in a straight line and be disposed parallel to the rotational axis R formed by the curved surface 250, and the plurality of rods 214 may be arranged along a direction substantially perpendicular to the rotational axis R (e.g., the direction along which the first housing 201 slides).

According to various embodiments, each rod of the rods 214 may pivot around another adjacent rod of the rods 214 while remaining parallel with the other adjacent rod. According to an embodiment, as the first housing 201 slides, the plurality of rods 214 may be arranged to form a curved shape or may be arranged to form a planar shape. For example, as the first housing 201 slides, a portion of the multi-bar structure 213 facing the curved surface 250 may form a curved surface, and another portion of the multi-bar structure 213 that does not face the curved surface 250 may form a flat surface. According to an embodiment, the first display area A1 of the display 203 may be mounted or supported on the multi-bar structure 213, and in the open state (e.g., FIG. 3), at least a portion of the first display area A1, along with the second display area A2, may be exposed to the outside of the second housing 202. In the state in which the first display area A1 is exposed to the outside of the second housing 202, the multi-bar structure 213 may substantially form a flat surface, thereby supporting or maintaining the first display area A1 in the flat state. According to an embodiment, the multi-bar structure 213 may be replaced with a bendable integral supporting member (not shown). According to an embodiment, the multi-bar structure 213 may be interpreted as a display supporting multi-bar or articulated hinge structure.

According to various embodiments, the guide rail 215 may guide the movement of the plurality of rods 214. According to an embodiment, the guide rail 215 may include an upper guide rail adjacent to the 1-2th sidewall (e.g., the 1-2th sidewall 211b in FIG. 3) and a lower guide rail adjacent to the 1-3th sidewall (e.g., the 1-3th sidewall 211c). According to an embodiment, the guide rail 215 may include a groove-shaped rail 215a formed inside the guide rail 215 and a protrusion 215b positioned inside the guide rail. At least a portion of the protrusion 215b may be surrounded by the rail 415a. According to an embodiment, the multi-bar structure 213 may be positioned between the upper guide rail and the lower guide rail and may move while remaining engaged with the upper and lower guide rails. For example, upper and/or lower portions of the plurality of rods 214 may slide along the rail 215a while fitted into the rail 215a.

According to an embodiment, when the electronic device 101 is opened (e.g., a slide-out operation), the size of the area where the display 203 is exposed to the outside may be increased. For example, by driving the motor structure 260 (e.g., driving for sliding out the display) and/or by an external force provided by the user, the first plate 211 connected with the motor structure 260 may be slid out, and the protrusion 215b inside the guide rail 215 may push out the upper and/or lower ends of the plurality of rods 214. Accordingly, the display 203 received between the first plate 211 and the slide cover 212 may be expanded to the front.

According to an embodiment, when the electronic device 101 is closed (e.g., a slide-in operation), the size of the area where the display 203 is exposed to the outside may be reduced. For example, by driving the motor structure 260 (e.g., driving for sliding in the display) and/or by an external force provided by the user, the first plate 211 where the motor is disposed may be slid in, and the outer portion (e.g., a portion other than the protrusion 215b) of the guide rail 215 may push out the upper and/or lower ends of the plurality of rods 214. Accordingly, the expanded display 203 may be received between the first plate 211 and the slide cover 212.

According to various embodiments, the second housing 202 may include a second plate 221, a cover member 222, and a rear plate 223. According to an embodiment, the second plate 221 may support at least a portion (e.g., the second display area A2) of the display 203. The second plate 221 may be disposed between the display 203 and the circuit board 204 (e.g., main circuit board). According to an embodiment, the cover member 222 may receive components (e.g., the battery 289 (e.g., the battery 189 of FIG. 1) and the circuit board 204) of the electronic device 101 and may protect the components of the electronic device 101. According to an embodiment, the cover member 222 may be referred to as a book cover.

According to various embodiments, a plurality of circuit boards may be received in the second housing 202. A processor, memory, and/or interface may be mounted on the circuit board 204. The processor may include one or more of, e.g., a central processing unit, an application processor, a graphic processing device, an image signal processing, a sensor hub processor, or a communication processor. According to various embodiments, the circuit board 204 may include a flexible printed circuit board type radio frequency cable (FRC). For example, the circuit board 204 may be disposed in the cover member 222 and may be electrically connected with an antenna module (e.g., the antenna module 197 of FIG. 1) and a communication module (e.g., the communication module 190 of FIG. 1).

According to an embodiment, the memory may include, e.g., a volatile or non-volatile memory.

According to an embodiment, the interface may include, for example, a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to various embodiments, the electronic device 101 may further include a separate circuit board 290 (e.g., sub circuit board) spaced apart from the circuit board 204 in the second housing 202. The sub circuit board 290 may be electrically connected with the main circuit board 204 through the flexible circuit board 291. The sub circuit board 290 may be electrically connected with electrical components disposed in an end of the electronic device 101, such as the battery 289 or a speaker and/or a sim socket, and may transfer signals and power.

According to an embodiment, the battery 289 may be a device for supplying power to at least one component of the electronic device 101. The battery 189 may include, e.g., a primary cell which is not rechargeable, a secondary cell which is rechargeable, or a fuel cell. At least a portion of the battery 289 may be disposed on substantially the same plane as the circuit board 204. The battery 289 may be integrally or detachably disposed inside the electronic device 101.

According to various embodiments, the battery 289 may be formed as a single embedded battery or may include a plurality of removable batteries (e.g., the first battery 289*a* and the second battery 289*b*). According to an embodiment, when the embedded battery is positioned on the first plate 211, the embedded battery may move as the first plate 211 slides. According to an embodiment, when the embedded battery is positioned on the second plate 221, the embedded battery may be fixedly disposed on the second plate 221, regardless of the slide of the first plate 211. As another example, when the first battery 289*a* of the removable batteries is positioned on the first plate 211, and the second battery 289*b* of the removable batteries is fixedly positioned on the second plate 221, only the first battery 289*a* may move as the first plate 211 slides.

According to various embodiments, the rear plate 223 may substantially form at least a portion of the exterior of the second housing 202 or the electronic device 101. For example, the rear plate 223 may be coupled to the outer surface of the cover member 222. According to an embodiment, the rear plate 223 may be integrally formed with the cover member 222. According to an embodiment, the rear plate 223 may provide a decorative effect on the exterior of the electronic device 101. The second plate 221 and the cover member 222 may be formed of at least one of a metal or a polymer, and the rear plate 223 may be formed of at least one of metal, glass, synthetic resin or ceramic. According to an embodiment, the second plate 221, the cover member 222 and/or the rear plate 223 may be formed of a material that transmits light at least partially (e.g., the auxiliary display area). For example, in a state in which a portion of the display 203 (e.g., the first display area A1) is received in the electronic device 101, the electronic device 101 may output visual information using the first display area A1. The auxiliary display area may be a portion of the second plate 221, the cover member 222, and/or the rear plate 223 in which the display 203 received in the second housing 202 is positioned.

According to various embodiments, the electronic device 101 may include a driving body 270. According to an embodiment, the driving body 270 may reduce the force required to open the electronic device 101. When the display 203 is extended, the driving body 270 may provide a force (e.g., elastic force) to offset at least a portion of the frictional force between the driving body 270 and components (e.g., the multi-bar structure 213 and/or guide rail 215) and/or repulsive force of the display 203. For example, as the driving body 270 offsets the repulsive force generated when the display 203 is extended, the user convenience when the electronic device 101 is opened may be increased. According to an embodiment, the driving body 270 may be interpreted as an actuator for generating at least a portion of the driving force for sliding the electronic device 101 or a hinge structure for guiding the slide of the electronic device 101.

According to various embodiments, the driving body 270 may be connected with the first housing (e.g., the first housing 201 of FIG. 3) and the second housing (e.g., the second housing 202 of FIG. 3). For example, the driving body 270 may be connected to the first plate 211 and the second plate 221. According to an embodiment, the first plate 211 may slide with respect to the second plate 221 using the driving body 270. For example, the driving body 270 may transfer the force (e.g., elastic force) in the second direction (e.g., Y-axis direction), in the first direction (e.g., X-axis direction). The driving body 270 may transfer the elastic force to the first plate 211 and/or the second plate 221 using the arm structure provided from the elastic structure.

According to an embodiment, the electronic device 101 may include a motor structure 260 and a gear structure (e.g., the rack gear 261 and/or pinion gear (not shown)) configured to at least partially move based on the driving force generated from the motor structure 260. For example, the electronic device 101 may include a rack gear 261 connected to the first housing 201 (e.g., the first plate 211) and the motor structure 260 connected to the second housing 202 (e.g., the second plate 221) and a pinion gear configured to rotate based on the driving force generated from the motor structure 260. According to an embodiment, the driving body 270 may be operated independently of the motor structure 260. For example, the user may use either the driving body 270 or the motor structure 260 to open the electronic device 101. According to an embodiment, the pinion gear may receive the driving force from the motor structure 260 to rotate, and the rack gear 261 connected with the pinion gear may slide according to rotation of the pinion gear. The first housing 201 (e.g., the first plate 211) connected with the rack gear 261 may slide together, according to the slide of the rack gear 261.

According to an embodiment, the driving body 270 may provide a driving force for sliding the electronic device 101, along with the driving force generated from the motor structure 260. For example, the driving body 270 may function as a trigger device that provides a force for initial opening of the electronic device 101.

According to an embodiment, the driving body 270 may include a plurality of (e.g., two) driving bodies. For example, the driving body 270 may include a first driving body 271 and a second driving body 272 positioned to be substantially symmetrical with the first driving body 271.

The electronic device 101 disclosed in FIGS. 2 to 4 has a rollable or slidable appearance but is not limited thereto. According to an embodiment (not shown), at least a portion of the illustrated electronic device may be rolled up in a scroll shape.

Referring to FIGS. 2 to 4, when viewed from the front of the electronic device 101, the display 203 may expand to the right of the electronic device 101. However, the structure of the electronic device 101 is not limited thereto. For example, according to an embodiment, the display 203 may expand to the left of the electronic device 101.

Figure 5A:
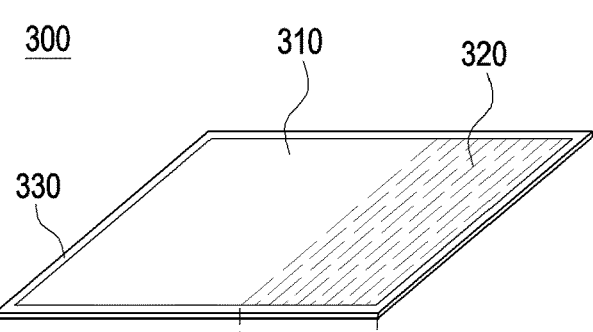
FIG. 5A is a view illustrating a heat dissipation structure in an extended state according to various embodiments of the disclosure.
Figure 5B:
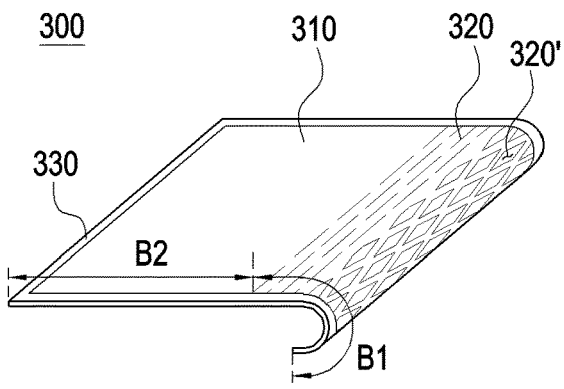
FIG. 5B is a view illustrating a heat dissipation structure with at least a portion rolled according to various embodiments of the disclosure.
Figure 5C:
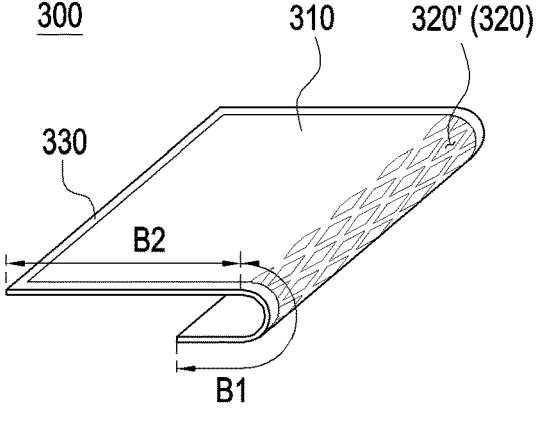
FIG. 5C is a view illustrating a heat dissipation structure with at least a portion rolled according to various embodiments of the disclosure.

FIG. 5A is a view illustrating a heat dissipation structure in an extended state according to various embodiments of the disclosure; FIG. 5B is a view illustrating a heat dissipation structure with at least a portion rolled according to various embodiments of the disclosure; FIG. 5C is a view illustrating a heat dissipation structure with at least a portion rolled according to various embodiments of the disclosure; For example, FIG. 5A shows a shape and/or placement of the heat dissipation structure in an opened state of the electronic device (e.g., the opened state of the electronic device 101 of FIG. 3), and FIG. 5C shows a shape and/or placement of the heat dissipation structure in a closed state of the electronic device (e.g., the closed state of the electronic device 101 of FIG. 2). For example, the shape and/or placement of the heat dissipation structure of FIG. 5B may be an intermediate state in which the heat dissipation structure changes from the opened state of FIG. 5A to the closed state of FIG. 5C or an intermediate state in which the heat dissipation structure changes from the closed state of FIG. 5C to the opened state of FIG. 5A.

Referring to FIGS. 5A to 5C, according to various embodiments of the disclosure, the heat dissipation structure 300 may include a heat dissipation sheet 310, a slit structure 320, and/or a supporting member 330.

According to various embodiments, the heat dissipation sheet 310 may be configured to receive the heat generated from an electrical component (not shown) (e.g., the battery 289 of FIG. 4, the main circuit board 204 of FIG. 4, and/or the sub circuit board 290 of FIG. 4) disposed in the housing (not shown) (e.g., the first housing 201 of FIG. 4 and/or the second housing 202 of FIG. 4). For example, the heat dissipation sheet 310 may receive the heat generated from the electrical component and diffuse the received heat to the surface in the surface direction of the heat dissipation sheet 310. According to various embodiments, the heat dissipation sheet 310 may include a flexible material. According to an embodiment, the heat dissipation sheet 310 may include a sheet member including at least one of a copper (Cu) sheet, a graphite sheet, or a metal sheet, a protective film configured to protect the sheet member, and an adhesive configured to attach the sheet member and the protective film. As an example, the protective film may include at least one of a polyethylene terephthalate (PET) film, a thermoplastic polyurethane (TPU) film, or a urethane film. The adhesive may include at least one of an acrylic resin, a silicone resin, a styrene resin, a polyester resin, a rubber resin, or a urethane resin. According to some embodiments, the heat dissipation sheet 310 may include various means or materials capable of receiving heat from an electrical component and diffusing the heat in the surface direction of the heat dissipation sheet 310.

According to various embodiments, the heat dissipation sheet 310 may include a bending area B1 facing a first display area (not shown) (e.g., the first display area A1 of FIG. 4) and a fixed area B2 facing a second display area (not shown) (e.g., the second display area A2 of FIG. 4).

According to various embodiments, the fixed area B2 may have at least a portion disposed between the second display area (not shown) (e.g., the second display area A2 of FIG. 4) and the second housing (not shown) (e.g., the second housing 202 of FIG. 4). According to an embodiment, the fixed area B2 may have at least a portion disposed between the second display area (not shown) (e.g., the second display area A2 of FIG. 4) and the second plate (not shown) (e.g., the second plate 221 of FIG. 4). For example, the fixed area B2 may have a fixed position with respect to the second plate (not shown) (e.g., the second plate 221 of FIG. 4).

According to various embodiments, the bending area B1 may have at least a portion disposed between the first display area (not shown) (e.g., the first display area A1 of FIG. 4) and the first housing (not shown) (e.g., the first housing 201 of FIG. 4). According to an embodiment, the bending area B1 may have at least a portion disposed between the first display area (not shown) (e.g., the first display area A1 of FIG. 4) and the first plate (not shown) (e.g., the first plate 211 of FIG. 4). According to an embodiment, the bending area B1 may have at least a portion disposed between the first display area (not shown) (e.g., the first display area A1 of FIG. 4) and a multi-bar structure (not shown) (e.g., the multi-bar structure 213 of FIG. 4). For example, the bending area B1 may be rolled or unrolled along with the first display area (not shown) (e.g., the first display area A1 of FIG. 4) and/or the multi-bar structure 213.

According to various embodiments, the slit structure 320 may be configured to supplement (or receive) deformation of the bending area B1. According to an embodiment, the slit structure 320 may be formed in at least a portion of the bending area B1. According to an embodiment, the slit structure 320 may have at least a portion extending along a first direction inclined from the slide direction (e.g., the direction indicated by arrow ① in FIG. 3C) of the first housing (not shown) (e.g., the first housing 201 of FIG. 4). According to an embodiment, the first direction may be substantially perpendicular to the slide direction of the first housing. According to another embodiment, the first direction may be a direction which forms an acute angle from the slide direction of the first housing.

According to various embodiments, the slit structure 320 may have a slit shape penetrating the upper and lower surfaces of the heat dissipation sheet 310. According to an embodiment, there may be provided a plurality of slit structures 320, and two adjacent slit structures 320 may be disposed parallel to each other or together on a virtual straight line. The plurality of slit structures 320 may be disposed to cross each other as shown, but without limitations thereto, may be disposed in other various shapes. According to an embodiment, the slit structure 320 may supplement (or receive) the extension or contraction of at least a portion (e.g., the bending area B1) of the heat dissipation sheet 310.

According to various embodiments, the supporting member 330 may support at least a portion of the heat dissipation sheet 310. According to an embodiment, the supporting member 330 may support one surface of the heat dissipation sheet 310 (e.g., one surface facing opposite to the surface facing the display 203 of FIG. 4, of the heat dissipation sheet 310). According to an embodiment, the supporting member 330 may have a panel shape with a recess or the heat dissipation sheet 310 may be stacked on the recess of the supporting member 330. According to another embodiment, the supporting member 330 may have a panel shape with no recess, and the heat dissipation sheet 310 may be stacked on one surface (e.g., the surface facing the display 203 of FIG. 4) of the supporting member 330. In some embodiments, the heat dissipation sheet 310 may be interpreted as stacked on the upper surface (e.g., the surface facing the display 203 of FIG. 4) of the supporting member 330. According to some embodiments, the supporting member 330 may have various structures capable of stacking of the heat dissipation sheet 310 and supporting the display (not shown) (e.g., the display 203 of FIG. 4). According to an embodiment, the supporting member 330 may include a flexible material. According to an embodiment, the supporting member 330 may be attached and/or coupled to the rear surface (or inner surface) (e.g., the face facing the first plate 211 and/or second plate 221 of FIG. 4) of the display (not shown) (e.g., the display 203 of FIG. 4), be attached and/or coupled to a bracket (not shown) configured to support the display (not shown) (e.g., the display 203 of FIG. 4), or be attached and/or coupled to the outer surface of the guide rail (not shown) (e.g., the guide rail 215 of FIG. 4). According to some embodiments, the supporting member 330 may be attached and/or coupled to various components or be disposed in various positions to be able to support the display (not shown) (e.g., the display 203 of FIG. 4). According to some embodiments, the supporting member 330 may include a metal material including at least one of Cu, SUS, Al, or Mg and/or a non-metal material including at least one of polycarbonate (PC), polyamide (PA), polybutylene terephthalate (PBA), or polymer.

According to an embodiment, the supporting member 330 may be disposed within a housing (not shown) (e.g., the first housing 201 of FIG. 4 and/or the second housing 202 of FIG. 4), and at least a portion thereof may support the display (not shown) (e.g., the display 203 of FIG. 4). For example, the supporting member 330 may support an inner surface (e.g., the surface facing the first plate 211 of FIG. 4 and/or the second plate of FIG. 4) of the display (not shown) (e.g., the display 203 of FIG. 4). According to an embodiment, at least a portion of the supporting member 330 may be coupled and/or connected to the first plate (not shown) (e.g., the first plate 211 of FIG. 4) and, as the first plate (not shown) (e.g., the first plate 211 of FIG. 4) slides, at least a portion thereof may be rolled or unrolled. According to another embodiment, at least a portion of the supporting member 330 may be coupled and/or connected to a multi-bar structure (not shown) (e.g., the multi-bar structure 213 of FIG. 4) and be rolled or unrolled along with the multi-bar structure (not shown) (e.g., the multi-bar structure 213 of FIG. 4). According to an embodiment, the supporting member 330 may be interpreted as some components of the heat dissipation structure 300. According to another embodiment, the supporting member 330 may be interpreted as a separate component from the heat dissipation structure 300.

Described with reference to FIGS. 5A to 5C is described the operation and/or deformation of the heat dissipation structure 300 when the electronic device (not shown) (e.g., the electronic device 101 of FIGS. 2 to 4) moves from the opened state to the closed state.

Referring to FIG. 5A, in the opened state (e.g., the opened state of the electronic device 101 of FIG. 3) of the electronic device, the bending area B1 and the fixed area B2 in the heat dissipation structure 300 may form substantially flat surfaces. In an embodiment, in the opened state of the electronic device, the fixed area B2 may receive the heat generated from the battery (not shown) (e.g., the battery 289 of FIG. 4), the main circuit board (not shown) (e.g., the main circuit board 204 of FIG. 4), or the sub circuit board (not shown) (e.g., the sub circuit board 290 of FIG. 4) and diffuse the received heat in the surface direction of the fixed area B2 or in the surface direction of the heat dissipation sheet 310. In an embodiment, in the opened state of the electronic device, the bending area B1 may receive the heat generated from the motor structure (not shown) (e.g., the motor structure 260 of FIG. 4) and/or an electrical component (not shown) disposed on the first plate (not shown) (e.g., the first plate 211 of FIG. 4) and diffuse the received heat in the surface direction of the bending area B1 and/or in the surface direction of the heat dissipation sheet 310.

For example, when the electronic device moves from the opened state to the closed state, the heat dissipation structure 300 may change from the placement and/or shape as shown in FIG. 5A through the placement and/or shape as shown in FIG. 5B to the placement and/or shape as shown in FIG. 5C.

Referring to FIGS. 5B and/or 5C, when the electronic device moves from the opened state to the closed state, at least a portion of the bending area B1 in the heat dissipation sheet 310 may be bent. For example, at least a portion (e.g., the bending area B1) of the heat dissipation structure 300 may be received in the first housing (not shown) (e.g., the first housing 201 of FIG. 4). As at least a portion (e.g., the bending area B1) of the heat dissipation structure 300, received in the first housing (not shown), along with the first housing (not shown), is received in the second housing (not shown) (e.g., the second housing 202 of FIG. 4), the bending area B1 of the heat dissipation sheet 310 and at least a portion (e.g., the portion supporting the bending area B1) may be received in the second housing 202. Of the bending area B1, a portion facing the curved surface (not shown) (e.g., the curved surface 250 of FIG. 4) may be bent. In this case, the portion of the bending area B1, facing the curved surface (not shown) (e.g., the curved surface 250 of FIG. 4) may increase in area in the slide direction. For example, the portion of the supporting member 330, facing the curved surface (not shown) (e.g., the curved surface 250 of FIG. 4), may be rotated and/or rolled while forming a first radius of curvature with respect to the curved surface (not shown) (e.g., the curved surface 250 of FIG. 4). In this case, the portion of the bending area B1, facing the curved surface (not shown) (e.g., the curved surface 250 of FIG. 4), may be rotated and/or rolled while forming a second radius of curvature, larger than the first radius of curvature, with respect to the curved surface (not shown) (e.g., the curved surface 250 of FIG. 4). According to an embodiment, since the portion of the bending area B1 is rotated to be larger than the portion of the supporting member 330 corresponding to the portion of the bending area B1 with respect to the curved surface (not shown) (e.g., the curved surface 250 of FIG. 4), the bending area B1 may increase in area in the slide direction. For example, in the state (e.g., the slide-out state (e.g., FIG. 3)) as shown in FIG. 5A, the distance in the slide direction of the slit structures 320 disposed adjacent and parallel to each other (or distance (width) on the surface of the heat dissipation sheet 310) may be a first distance. For example, in the state as shown in FIG. 5B (e.g., an intermediate state in the middle of moving from the slide-out state (e.g., FIG. 3) to the slide-in state (e.g., FIG. 2)) and/or the state as shown in FIG. 5C (e.g., the slide-in state (e.g., FIG. 2), the distance in the slide direction of at least some of the slit structures 320 (e.g., the slit structures 320' in the bending portion) disposed adjacent and parallel to each other (or the distance (width) on the surface of the heat dissipation sheet 310) may be a second distance larger than the first distance. If the slit structures 320 are not formed in the heat dissipation sheet 310, at least a portion of the bending area B1 may be weakened and torn or cracked as extension and/or contraction of the bending area B1 is repeated. According to an embodiment, when the bending area B1 is extended, the slit structures 320 disposed in the extending bending area B1 may be expanded, bearing the extension of the bending area B1. According to an embodiment, when the bending area B1 is shrunken, the slit structures 320 disposed in the shrunken bending area B1 are contracted, bearing the shrinkage of the bending area B1. In the closed state (e.g., the closed state of the electronic device 101 of FIG. 2) of the electronic device, the heat dissipation structure 300 may be disposed as shown in FIG. 5C.

Figure 6A:
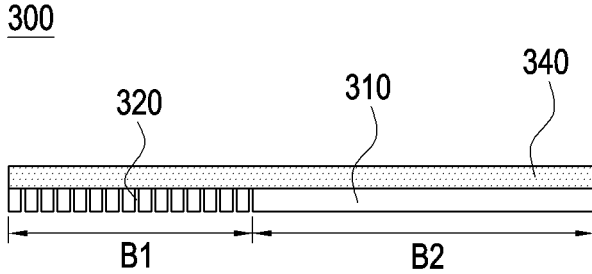
FIG. 6A is a view illustrating a heat dissipation structure in an extended state according to various embodiments of the disclosure.
Figure 6B:
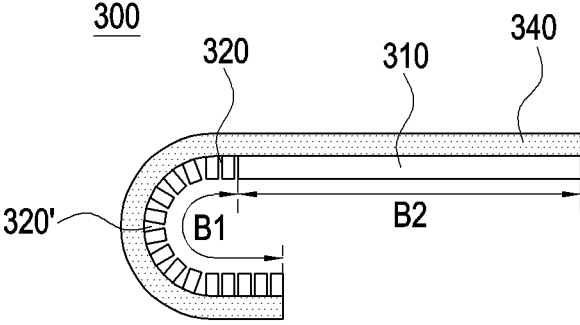
FIG. 6B is a view illustrating a heat dissipation structure with at least a portion rolled according to various embodiments of the disclosure.

FIG. 6A is a view illustrating a heat dissipation structure in an extended state according to various embodiments of the disclosure. FIG. 6B is a view illustrating a heat dissipation structure with at least a portion rolled according to various embodiments of the disclosure.

Referring to FIGS. 6A and/or 6B, according to various embodiments of the disclosure, a heat dissipation structure 300 (e.g., the heat dissipation structure 300 of FIGS. 5A to 5C) may include a heat dissipation sheet 310, a slit structure 320, and/or an elastic member 340.

The configuration of the heat dissipation structure 300, the heat dissipation sheet 310 and/or the slit structure 320 of FIGS. 6A and/or 6B may be identical in whole or part to the configuration of the heat dissipation structure 300, the heat dissipation sheet 310, and/or the slit structure 320 of FIGS. 5A, 5B, and/or 5C.

According to various embodiments, the heat dissipation sheet 310 (e.g., the heat dissipation sheet 310 of FIGS. 5A to 5C) may include a bending area B1 (e.g., the bending area B1 of FIGS. 5A to 5C) and/or a fixed area B2 (e.g., the fixed area B2 of FIGS. 5A to 5C).

According to various embodiments, the slit structure 320 (e.g., the slit structure 320 of FIGS. 5A to 5C) may be formed in at least one portion of the bending area B1.

According to various embodiments, the elastic member 340 may be stacked on one surface of the heat dissipation sheet 310. According to an embodiment, the elastic member 340 may be bent together with the bending area B1 of the heat dissipation sheet 310. According to an embodiment, when the bending area B1 is bent, at least some 320' of the slit structures 320 may be bent together with the bending area B1. According to an embodiment, the elastic member 340 may provide an elastic restorative force to the bending area B1 when the bending area B1 of the heat dissipation sheet 310 is extended. According to an embodiment, the elastic member 340 may be stacked on the surface of the heat dissipation sheet 310, which faces the display (not shown) (e.g., the display 203 of FIG. 4). According to an embodiment, the elastic member 340 may be formed by impregnating (or injecting) or thermocompressing a molecular filler including at least one of graphite or boron nitride with thermal conductivity and a compound including at least one of thermoplastic polyurethane, rubber, or silicone having elasticity, to a green sheet. According to some embodiments, the elastic member 340 may include various means capable of providing an elastic restorative force to the heat dissipation sheet 310. According to the illustrated embodiment, the elastic member 340 may be stacked on one surface of the heat dissipation sheet 310 (e.g., the surface facing the display 203 of FIG. 4). According to some embodiments (not shown), the elastic member 340 may be stacked on another surface (e.g., the surface facing the first plate 211 of FIG. 4) opposite to the surface (e.g., the surface facing the display 203 of FIG. 4) of the heat dissipation sheet 310. In an embodiment, as the elastic member 340 includes a molecular filler having thermal conductivity, it is possible to supplement the thermal conductivity of the portion with the slit structures 320 of the heat dissipation sheet 310.

Figure 7A:
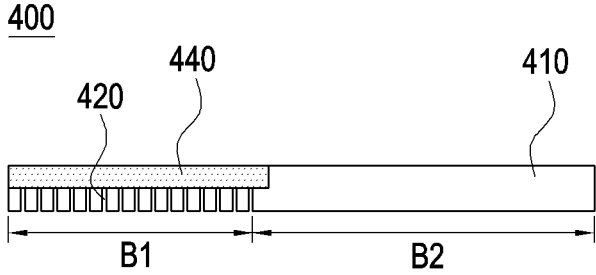
FIG. 7A is a view illustrating a heat dissipation structure in an extended state according to various embodiments of the disclosure.
Figure 7B:
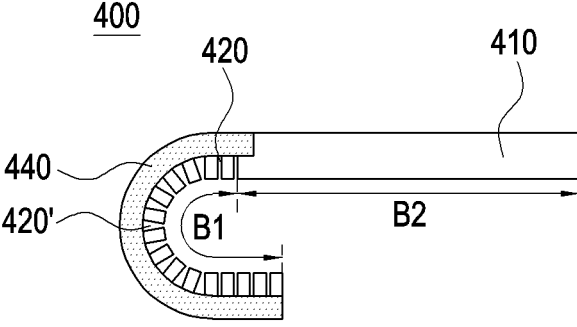
FIG. 7B is a view illustrating a heat dissipation structure with at least a portion rolled according to various embodiments of the disclosure.

FIG. 7A is a view illustrating a heat dissipation structure in an extended state according to various embodiments of the disclosure. FIG. 7B is a view illustrating a heat dissipation structure with at least a portion rolled according to various embodiments of the disclosure.

Referring to FIGS. 7A and/or 7B, a heat dissipation structure 400 (e.g., the heat dissipation structure 300 of FIGS. 5A to 5C) may include a heat dissipation sheet 410, a slit structure 420, and/or an elastic member 440.

Referring to FIGS. 7A and/or 7B, according to various embodiments of the disclosure, a heat dissipation structure 300 (e.g., the heat dissipation structure 300 of FIGS. 5A to 5C) may include a heat dissipation sheet 410, a slit structure 420, and/or an elastic member 440.

The configuration of the heat dissipation structure 400, the heat dissipation sheet 410 and/or the slit structure 420 of FIGS. 7A and/or 7B may be identical in whole or part to the configuration of the heat dissipation structure 400, the heat dissipation sheet 410, and/or the slit structure 420 of FIGS. 5A, 5B, and/or 5C.

According to various embodiments, the heat dissipation sheet 410 (e.g., the heat dissipation sheet 310 of FIGS. 5A to 5C) may include a bending area B1 (e.g., the bending area B1 of FIGS. 5A to 5C) and/or a fixed area B2 (e.g., the fixed area B2 of FIGS. 5A to 5C).

According to various embodiments, the slit structure 420 (e.g., the slit structure 320 of FIGS. 5A to 5C) may be formed in at least one portion of the bending area B1.

According to various embodiments, the elastic member 440 may be stacked on one surface of the heat dissipation sheet 410. According to an embodiment, the elastic member 440 may be stacked on one surface of the bending area B1. According to an embodiment, the elastic member 440 may be bent together with the bending area B1 of the heat dissipation sheet 410. According to an embodiment, when the bending area B1 is bent, at least some 420' of the slit structures 420 may be bent together with the bending area B1. According to an embodiment, the elastic member 440 may provide an elastic restorative force to the bending area B1 when the bending area B1 of the heat dissipation sheet 410 is extended. According to an embodiment, the elastic member 440 may be stacked on the surface of the bending area B1 of the heat dissipation sheet 410, which faces the display (not shown) (e.g., the display 203 of FIG. 4).

According to an embodiment, the elastic member 440 may be formed by impregnating (or injecting) or thermocompressing a molecular filler including at least one of graphite or boron nitride with thermal conductivity and a compound including at least one of thermoplastic polyurethane, rubber, or silicone having elasticity, to a green sheet. According to some embodiments, the elastic member 440 may include various means capable of providing an elastic restorative force to the heat dissipation sheet 410. According to the illustrated embodiment, the elastic member 440 may be stacked on one surface of the portion where the slit structure 420 is formed (e.g., the surface facing the display 203 of FIG. 4) in the heat dissipation sheet 410. According to some embodiments (not shown), the elastic member 440 may be stacked on another surface (e.g., the surface facing the first plate 211 of FIG. 4) opposite to the surface (e.g., the surface facing the display 203 of FIG. 4) of the portion where the slit structure 420 is formed in the heat dissipation sheet 410. In an embodiment, as the elastic member 440 includes a molecular filler having thermal conductivity, it is possible to supplement the thermal conductivity of the portion with the slit structures 420 of the heat dissipation sheet 410.

Figure 8A:
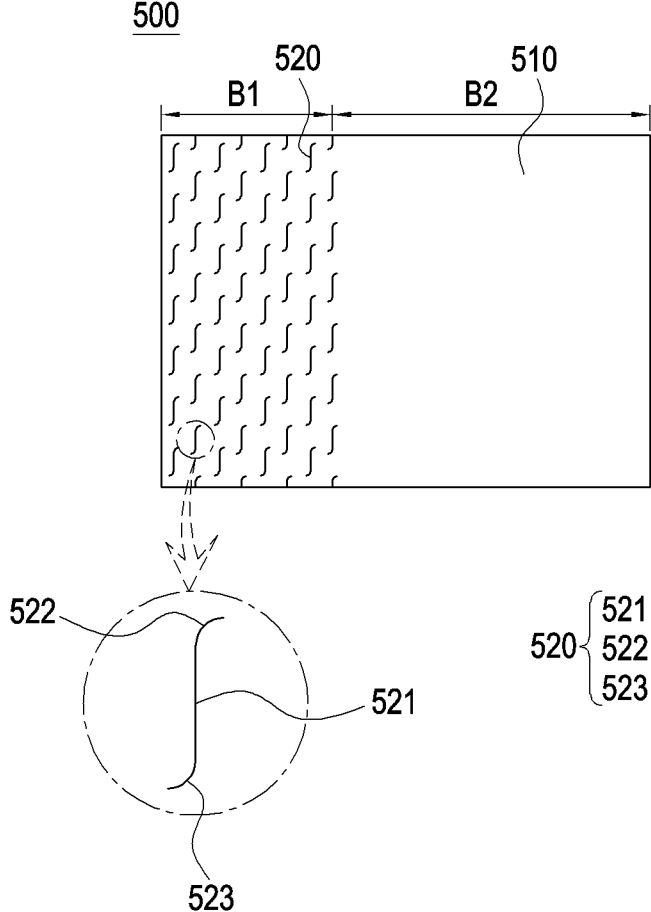
FIG. 8A is a view illustrating a heat dissipation structure according to various embodiments of the disclosure.

FIG. 8A is a view illustrating a heat dissipation structure according to various embodiments of the disclosure.

Referring to FIG. 8A, a heat dissipation structure 500 (e.g., the heat dissipation structure 300 of FIGS. 5A to 5C) may include a heat dissipation sheet 510 and/or a slit structure 520.

The configuration of the heat dissipation structure 500, the heat dissipation sheet 510 and/or the slit structure 520 of FIG. 8A may be identical in whole or part to the configuration of the heat dissipation structure 300, the heat dissipation sheet 310, and/or the slit structure 320 of FIGS. 5A to 5C.

According to various embodiments, the heat dissipation sheet 510 may include a bending area B1 (e.g., the bending area B1 of FIGS. 5A to 5C) and/or a fixed area B2 (e.g., the fixed area B2 of FIGS. 5A to 5C).

According to various embodiments, the slit structure 520 (e.g., the slit structure 320 of FIGS. 5A to 5C) may be formed in at least one portion of the bending area B1. According to various embodiments, the slit structure 520 may have at least a portion extending along a first direction inclined from the slide direction (e.g., the direction indicated by arrow ① in FIG. 3) of the first housing (not shown) (e.g., the first housing 201 of FIG. 4). According to an embodiment, the first direction may be substantially perpendicular to the slide direction of the first housing. According to another embodiment, the first direction may be a direction which forms an acute angle from the slide direction of the first housing.

According to various embodiments, the slit structure 520 may include a first portion 521, a second portion 522 formed at one end of the first portion 521, and/or a third portion 523 formed at the other end of the first portion 521.

According to an embodiment, the first portion 521 may extend substantially in a first direction inclined from the slide direction of the first housing (not shown) (e.g., the first housing 201 of FIG. 4). In an embodiment, the first direction may be substantially perpendicular to the slide direction of the first housing. In another embodiment, the first direction may form an acute angle with the slide direction of the first housing. According to an embodiment, the first portion 521 may have a slit shape penetrating the upper and lower surfaces of the bending area B1 and bear the extension and/or contraction of the bending area B1. According to an embodiment, the first portion 521 and its adjacent first portion 521 may be disposed together on a virtual straight line or may be disposed parallel to each other.

According to an embodiment, the second portion 522 may be formed at one end of the first portion 521 and at least a portion thereof may include a curved shape. According to an embodiment, the second portion 522 may extend in a second direction inclined from the first direction which is the extending direction of the first portion. According to an embodiment, the second portion 522 may have a slit shape penetrating the upper and lower surfaces of the bending area B1 and bear the extension and/or contraction of the bending area B1.

According to an embodiment, the third portion 523 may be formed at the other end of the first portion 521 and at least a portion thereof may include a curved shape. According to an embodiment, the third portion 523 may extend in a third direction inclined from the first direction which is the extending direction of the first portion. In an embodiment, the third direction may be a direction opposite to the second direction. According to an embodiment, the third portion 523 may have a slit shape penetrating the upper and lower surfaces of the bending area B1 and bear the extension and/or contraction of the bending area B1.

Figure 8B:
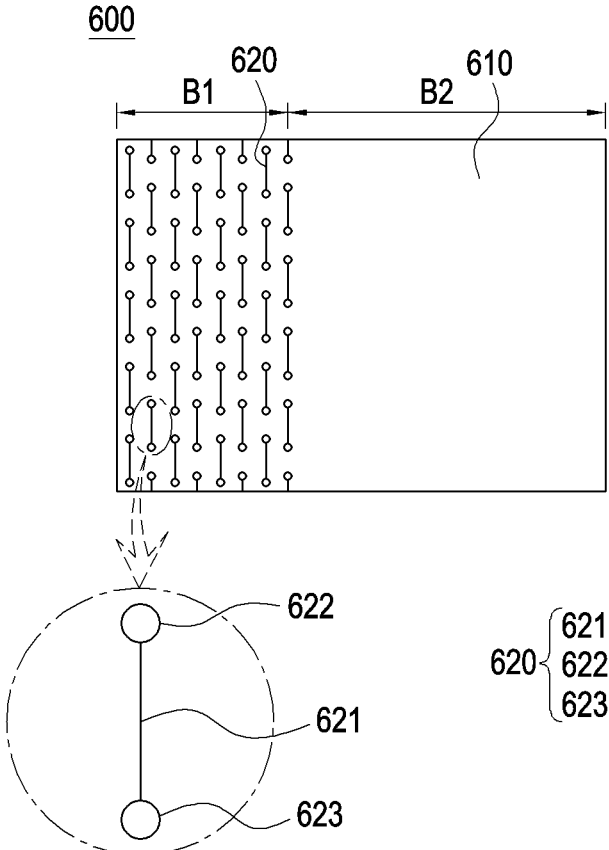
FIG. 8B is a view illustrating a heat dissipation structure according to various embodiments of the disclosure.

FIG. 8B is a view illustrating a heat dissipation structure according to various embodiments of the disclosure.

Referring to FIG. 8B, a heat dissipation structure 600 (e.g., the heat dissipation structure 300 of FIGS. 5A to 5C) may include a heat dissipation sheet 610 and/or a slit structure 620.

The configuration of the heat dissipation structure 600, the heat dissipation sheet 610 and/or the slit structure 620 of FIG. 8B may be identical in whole or part to the configuration of the heat dissipation structure 300, the heat dissipation sheet 310, and/or the slit structure 320 of FIGS. 5A to 5C.

According to various embodiments, the heat dissipation sheet 610 may include a bending area B1 (e.g., the bending area B1 of FIGS. 5A to 5C) and/or a fixed area B2 (e.g., the fixed area B2 of FIGS. 5A to 5C).

According to various embodiments, the slit structure 620 (e.g., the slit structure 320 of FIGS. 5A to 5C) may be formed in at least one portion of the bending area B1. According to various embodiments, the slit structure 620 may have at least a portion extending along a first direction inclined from the slide direction (e.g., the direction indicated by arrow ① in FIG. 3) of the first housing (not shown) (e.g., the first housing 201 of FIG. 4). According to an embodiment, the first direction may be substantially perpendicular to the slide direction of the first housing. According to another embodiment, the first direction may be a direction which forms an acute angle from the slide direction of the first housing.

According to various embodiments, the slit structure 620 may include a first portion 621, a second portion 622 formed at one end of the first portion 621, and/or a third portion 623 formed at the other end of the first portion 621.

According to an embodiment, the first portion 621 may extend substantially in a first direction inclined from the slide direction of the first housing (not shown) (e.g., the first housing 201 of FIG. 4). In an embodiment, the first direction may be substantially perpendicular to the slide direction of the first housing. In another embodiment, the first direction may form an acute angle with the slide direction of the first housing. According to an embodiment, the first portion 621 may have a slit shape penetrating the upper and lower surfaces of the bending area B1 and bear the extension and/or contraction of the bending area B1. According to an embodiment, the first portion 621 and its adjacent first portion 621 may be disposed together on a virtual straight line or may be disposed parallel to each other.

According to an embodiment, the second portion 622 may be formed at one end of the first portion 621 and at least a portion thereof may include a circular shape. According to an embodiment, the second portion 622 may have a hole shape penetrating the upper and lower surfaces of the bending area B1 and having a predetermined diameter and bear the extension and/or contraction of the bending area B1.

According to an embodiment, the third portion 623 may be formed at the other end of the first portion 621 and at least a portion thereof may include a circular shape. According to an embodiment, the third portion 623 may have a hole shape penetrating the upper and lower surfaces of the bending area B1 and having a predetermined diameter and bear the extension and/or contraction of the bending area B1.

Figure 8C:
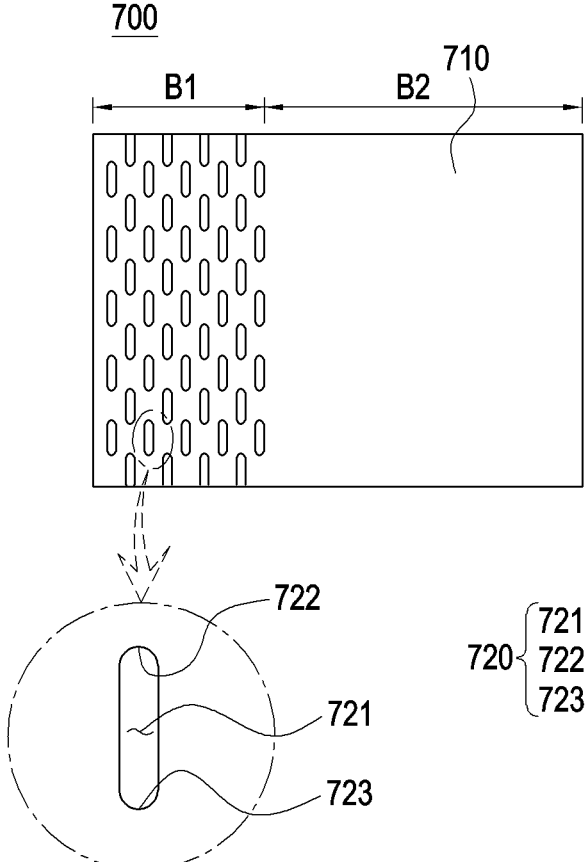
FIG. 8C is a view illustrating a heat dissipation structure according to various embodiments of the disclosure.

FIG. 8C is a view illustrating a heat dissipation structure according to various embodiments of the disclosure.

Referring to FIG. 8C, a heat dissipation structure 700 (e.g., the heat dissipation structure 300 of FIGS. 5A to 5C) may include a heat dissipation sheet 710 and/or a slit structure 720.

The configuration of the heat dissipation structure 700, the heat dissipation sheet 710 and/or the slit structure 720 of FIG. 8C may be identical in whole or part to the configuration of the heat dissipation structure 300, the heat dissipation sheet 310, and/or the slit structure 320 of FIGS. 5A to 5C.

According to various embodiments, the heat dissipation sheet 710 may include a bending area B1 (e.g., the bending area B1 of FIGS. 5A to 5C) and/or a fixed area B2 (e.g., the fixed area B2 of FIGS. 5A to 5C).

According to various embodiments, the slit structure 720 (e.g., the slit structure 320 of FIGS. 5A to 5C) may be formed in at least one portion of the bending area B1. According to various embodiments, the slit structure 720 may have at least a portion extending along a first direction inclined from the slide direction (e.g., the direction indicated by arrow ① in FIG. 3) of the first housing (not shown) (e.g., the first housing 201 of FIG. 4). According to an embodiment, the first direction may be substantially perpendicular to the slide direction of the first housing. According to another embodiment, the first direction may be a direction which forms an acute angle from the slide direction of the first housing.

According to various embodiments, the slit structure 720 may include a first portion 721, a second portion 722 formed at one end of the first portion 721, and/or a third portion 723 formed at the other end of the first portion 721.

According to an embodiment, the first portion 721 may extend substantially in a first direction inclined from the slide direction of the first housing (not shown) (e.g., the first housing 201 of FIG. 4). In an embodiment, the first direction may be substantially perpendicular to the slide direction of the first housing. In another embodiment, the first direction may form an acute angle with the slide direction of the first housing. According to an embodiment, the first portion 721 may have an opening shape penetrating the upper and lower surfaces of the bending area B1 and extending in a first direction and bear the extension and/or contraction of the bending area B1. According to an embodiment, the first portion 721 and its adjacent first portion 721 may be disposed together on a virtual straight line or may be disposed parallel to each other.

According to an embodiment, the second portion 722 may be formed at one end of the first portion 721 and at least a portion thereof may include a semi-circular shape. According to an embodiment, the second portion 722 may have a semi-circular hole shape penetrating the upper and lower surfaces of the bending area B1 and having a predetermined diameter and bear the extension and/or contraction of the bending area B1.

Figure 9:
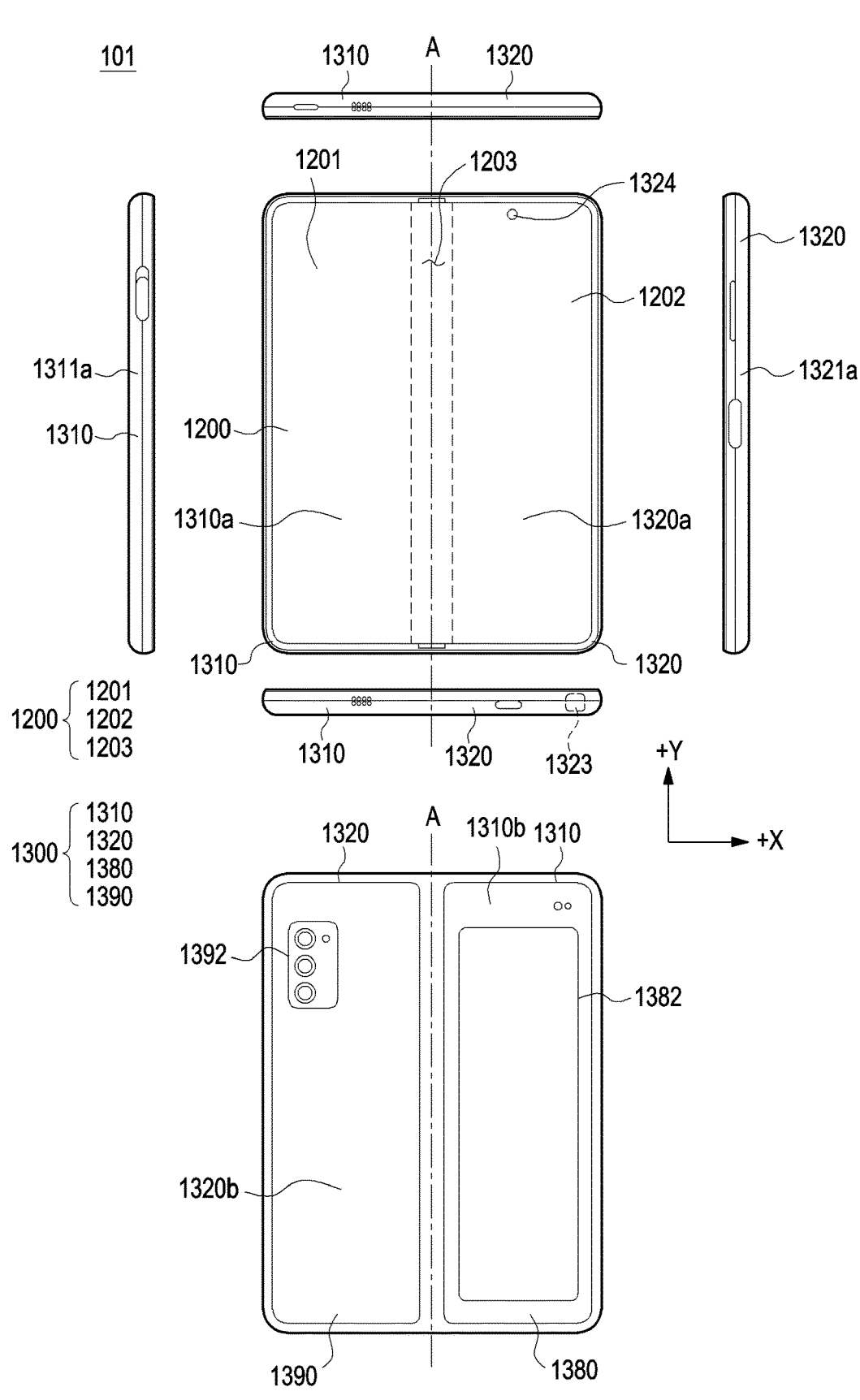
FIG. 9 is a view illustrating an unfolded status among folding statuses of a foldable electronic device according to various embodiments of the disclosure.
Figure 10:
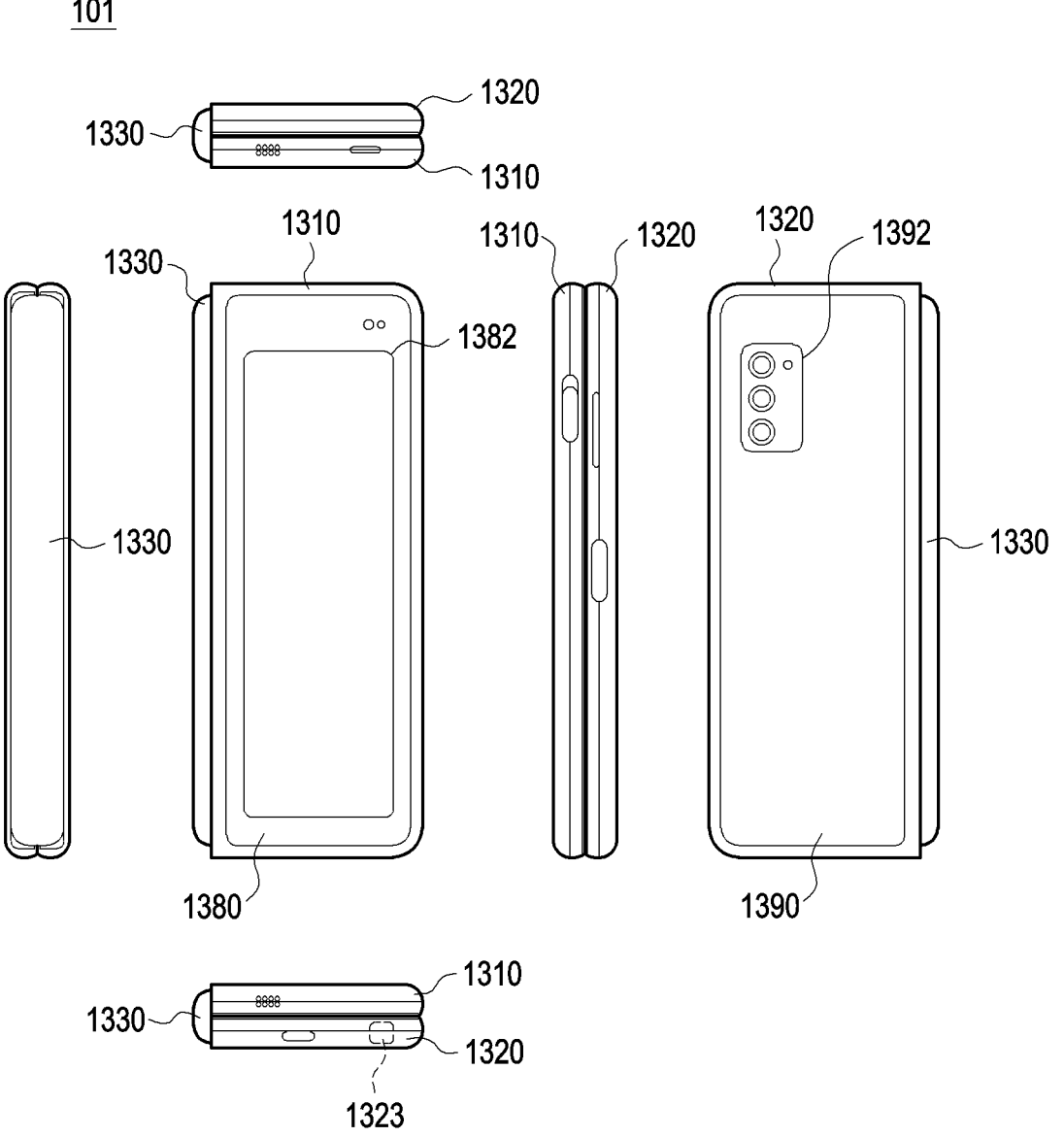
FIG. 10 is a view illustrating a folded status among folding statuses of a foldable electronic device according to various embodiments of the disclosure.

According to an embodiment, the third portion 723 may be formed at the other end of the first portion 721 and at least a portion thereof may include a semi-circular shape. According to an embodiment, the third portion 723 may have a semi-circular hole shape penetrating the upper and lower surfaces of the bending area B1 and having a predetermined diameter and bear the extension and/or contraction of the bending area B1. FIG. 9 is a view illustrating an unfolded status among folding statuses of a foldable electronic device according to various embodiments of the disclosure. FIG. 10 is a view illustrating a folded status among folding statuses of a foldable electronic device according to various embodiments of the disclosure.

Referring to FIGS. 9 and 10, in an embodiment, an electronic device 101 may include a foldable housing 1300, a hinge cover (e.g., the hinge cover 1330 of FIG. 10) covering a foldable portion of the foldable housing 1300, and a flexible or foldable display 1200 (hereinafter, simply "flexible display 1200") (e.g., the display device 160 of FIG. 1) disposed in a space formed by the foldable housing 1300. According to an embodiment, the surface on which the flexible display 1200 is disposed is defined as a front surface (e.g., a first surface 1310*a* and a third surface 1320*a*) of the electronic device 101. A surface opposite to the front surface is defined as a rear surface (e.g., a second surface 1310*b* and a fourth surface 1320*b*) of the electronic device 101. A surface surrounding the space between the front and rear surfaces is defined as a side surface (e.g., a first side surface 1311*a* and a second side surface 1321*a*) of the electronic device 101.

Figure 11:
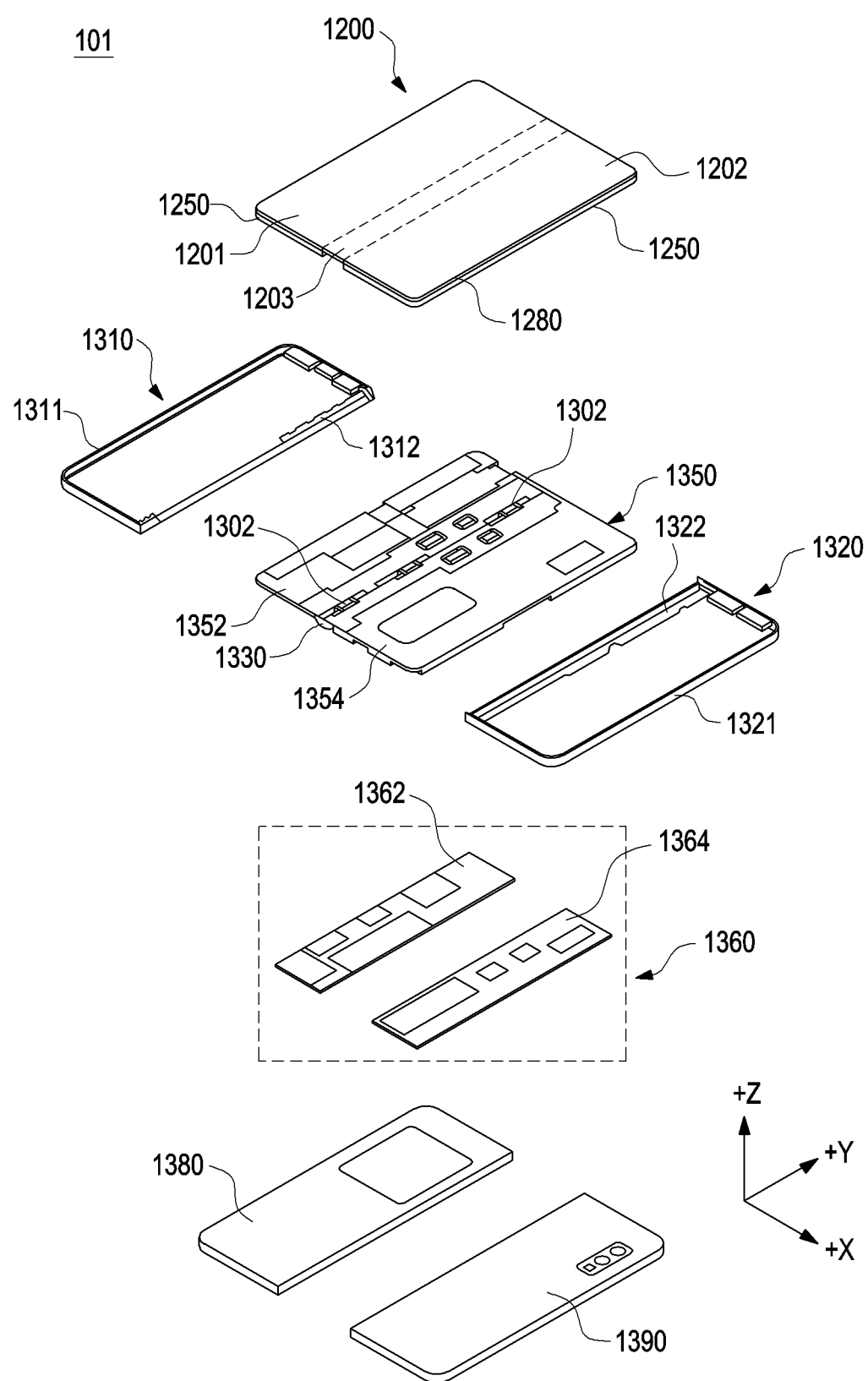
FIG. 11 is an exploded perspective view illustrating a foldable electronic device according to various embodiments of the disclosure.

According to various embodiments, the foldable housing 1300 may include a first housing 1310, a second housing 1320 including a sensor area 1324, a first rear cover 1380, a second rear cover 1390, and a hinge structure (e.g., the hinge structure 1302 of FIG. 11). The foldable housing 1300 of the electronic device 101 are not limited to the shape and coupling shown in FIGS. 9 and 10 but may rather be implemented in other shapes or via a combination and/or coupling of other components. For example, in another embodiment, the first housing 1310 and the first rear cover 1380 may be integrally formed with each other, and the second housing 1320 and the second rear cover 1390 may be integrally formed with each other.

According to various embodiments, the first housing 1310 may be connected to a hinge structure 1302 and may include a first surface 1310*a* facing in a first direction and a second surface 1310*b* facing in a second direction opposite to the first direction. The second housing 1320 may be connected to the hinge structure 1302 and may include a third surface 1320*a* facing in a third direction and a fourth surface 1320*b* facing in a fourth direction opposite to the third direction, and may rotate from the first housing 1310 on the hinge structure 1302. Thus, the electronic device 101 may turn into a folded state or unfolded state. In the folded state of the electronic device 101, the first surface 1310*a* may face the third surface 1320*a* and, in the unfolded state, the third direction may be identical to the first direction. According to an embodiment, in the unfolded state of the electronic device 101, the first direction and the third direction may be the +Z direction, and the second direction and the fourth direction may be the −Z direction. According to an embodiment, in the folded state of the electronic device 101, the first direction and the fourth direction may be the +Z direction, and the second direction and the third direction may be the −Z direction. Hereinafter, unless otherwise mentioned, directions are described based on the unfolded state of the electronic device 101.

According to various embodiments, the first housing 1310 and the second housing 1320 are disposed on both sides of the folding axis A and be overall symmetrical in shape with respect to the folding axis A. As set forth below, the first housing 1310 and the second housing 1320 may have different angles or distances formed therebetween depending on whether the electronic device 101 is in the unfolded, folded, or intermediate state. According to an embodiment, the second housing 1320 further includes the sensor area 1324 where various sensors are disposed, unlike the first housing 1310 but, in the remaining area, the second housing 1320 may be symmetrical in shape with the first housing 1310.

According to an embodiment, the electronic device 101 may include a structure into which a digital pen (not shown) may be inserted. For example, a hole 1323 into which the digital pen may be inserted may be formed in a side surface of the first housing 1310 or a side surface of the second housing 1320 of the electronic device 101. The digital pen may be inserted into, e.g., the hole 1323.

According to various embodiments, as shown in FIG. 9, the first housing 1310 and the second housing 1320 together may form a recess to receive the flexible display 1200.

According to various embodiments, the first housing 1310 and the second housing 1320 may at least partially be formed of a metal or non-metallic material with a rigidity selected to support the flexible display 1200. At least a portion formed of metal may provide a ground plane of the electronic device 101 and may be electrically connected with a ground line formed on a printed circuit board (e.g., the printed circuit board 1360 of FIG. 11).

According to various embodiments, the sensor area 1324 may be formed adjacent to an upper end of the second housing 1320 and to have a predetermined area. However, the placement, shape, or size of the sensor area 1324 is not limited to those illustrated. For example, in another embodiment, the sensor area 1324 may be provided in one corner, a different corner of the second housing 1320 or in any area between the top corner and the bottom corner. In an embodiment, components for performing various functions, embedded in the electronic device 101, may be exposed through the sensor area 1324 or one or more openings in the sensor area 1324 to the front surface of the electronic device 101. In various embodiments, the components may include various kinds of sensors. The sensor may include at least one of, e.g., a front-facing camera, a receiver, or a proximity sensor.

According to various embodiments, the first rear cover 1380 may be disposed on one side of the folding axis A on the rear surface of the electronic device 101 and have, e.g., a substantially rectangular periphery which may be surrounded by the first housing 1310. Similarly, the second rear cover 1390 may be disposed on the opposite side of the folding axis A on the rear surface of the electronic device 101 and its periphery may be surrounded by the second housing 1320.

According to various embodiments, the first rear cover 1380 and the second rear cover 1390 may be substantially symmetrical in shape with respect to the folding axis (axis A). However, the first rear cover 1380 and the second rear cover 1390 are not necessarily symmetrical in shape. In another embodiment, the electronic device 101 may include the first rear cover 1380 and the second rear cover 1390 in various shapes. In another embodiment, the first rear cover 1380 may be integrally formed with the first housing 1310, and the second rear cover 1390 may be integrally formed with the second housing 1320.

According to various embodiments, the first rear cover 1380, the second rear cover 1390, the first housing 1310, and the second housing 1320 may form a space where various components (e.g., a printed circuit board or battery) of the electronic device 101 may be disposed. According to an embodiment, one or more components may be arranged or visually exposed on/through the rear surface of the electronic device 101. For example, at least a portion of a sub display may be visually exposed through a first rear surface area 1382 of the first rear cover 1380. In another embodiment, one or more components or sensors may be visually exposed through a second rear surface area 1392 of the second rear cover 1390. According to various embodiments, the sensor may include a proximity sensor and/or a rear-facing camera.

According to various embodiments, a front camera exposed to the front surface of the electronic device 101 through one or more openings prepared in the sensor area 1324 or a rear camera exposed through a second rear surface area 1392 of the second rear cover 1390 may include one or more lenses, an image sensor, and/or an image signal processor. The flash 1313 may include, e.g., a light emitting diode (LED) or a xenon lamp. According to an embodiment, two or more lenses (an infrared (IR) camera, a wide-angle lens, and a telephoto lens) and image sensors may be disposed on one surface of the electronic device 101.

Referring to FIG. 10, the hinge cover 1330 may be disposed between the first housing 1310 and the second housing 1320 to hide the internal components (e.g., the hinge structure 1302 of FIG. 11). According to an embodiment, the hinge cover 1330 may be hidden by a portion of the first housing 1310 and second housing 1320 or be exposed to the outside depending on the state (e.g., the unfolded state (e.g., flat state) or folded state) of the electronic device 101.

According to an embodiment, as shown in FIG. 9, in the unfolded state of the electronic device 101, the hinge cover 1330 may be hidden, and thus not exposed, by the first housing 1310 and the second housing 1320. As another example, as shown in FIG. 10, in the folded state (e.g., a fully folded state) of the electronic device 101, the hinge cover 1330 may be exposed to the outside between the first housing 1310 and the second housing 1320. As another example, in an intermediate state in which the first housing 1310 and the second housing 1320 are folded with a certain angle, the hinge cover 1330 may be partially exposed to the outside between the first housing 1310 and the second housing 1320. In this case, however, the exposed area may be smaller than in the fully folded state. According to an embodiment, the hinge cover 1330 may include a curved surface.

According to various embodiments, the flexible display 1200 may be disposed in a space formed by the foldable housing 1300. For example, the flexible display 1200 may be seated on a recess formed by the foldable housing 1300 and may occupy most of the front surface of the electronic device 101. Thus, the front surface of the electronic device 101 may include the flexible display 1200 and a partial area of the first housing 1310 and a partial area of the second housing 1320, which are adjacent to the flexible display 1200. The rear surface of the electronic device 101 may include a first rear cover 1380, a partial area of the first housing 1310 adjacent to the first rear cover 1380, a second rear cover 1390, and a partial area of the second housing 1320 adjacent to the second rear cover 1390.

According to various embodiments, the flexible display 1200 may mean a display at least a portion of which may be transformed into a flat or curved surface. According to an embodiment, the flexible display 1200 may include a folding area 1203, a first display area 1201 disposed on one side of the folding area 1203 (e.g., the left side of the folding area 1203 of FIG. 9), and a second display area 1202 disposed on the opposite side of the folding area 1203 (e.g., the right side of the folding area 1203 of FIG. 9).

However, the segmentation of the flexible display 1200 as shown in FIG. 9 is merely an example, and the flexible display 1200 may be divided into a plurality of (e.g., four or more, or two) areas depending on the structure or function of the flexible display 1200. For example, in the embodiment illustrated in FIG. 9, the flexible display 1200 may be divided into the areas by the folding area 1203 or folding axis (axis A) extending in parallel with the y axis but, in another embodiment, the flexible display 1200 may be divided into the areas with respect to another folding area (e.g., a folding area parallel with the x axis) or another folding axis (e.g., a folding axis parallel with the x axis). According to an embodiment, the flexible display 1200 may be coupled with or disposed adjacent to a touch detection circuit, a pressure sensor capable of measuring the strength (pressure) of touches, and/or a digitizer for detecting a magnetic field-type stylus pen.

According to various embodiments, the length direction of the electronic device 101 may be the Y-axis direction, and the width direction of the electronic device 101 may be the X-axis direction.

According to various embodiments, the first display area 1201 and the second display area 1202 may be overall symmetrical in shape with respect to the folding area 1203. However, unlike the first display area 1201, the second display area 1202 may include a notch depending on the presence of the sensor area 1324, but the rest may be symmetrical in shape with the first display area 1201. In other words, the first display area 1201 and the second display area 1202 may include symmetrical portions and asymmetrical portions.

Described below are the operation of the first housing 1310 and the second housing 1320 and each area of the flexible display 1200 depending on the state (e.g., the unfolded state (or flat state), folded state, or intermediate state) of the electronic device 101.

According to various embodiments, when the electronic device 101 is in the unfolded state (flat state) (e.g., FIG. 9), the first housing 1310 and the second housing 1320 may be disposed to face in substantially the same direction while being angled at about 180 degrees therebetween. The surface of the first display area 1201 and the surface of the second display area 1202 of the flexible display 1200 may be angled at about 180 degrees therebetween while facing in substantially the same direction (e.g., forward of the front surface of the electronic device). The folding area 1203 may form substantially the same plane with the first display area 1201 and the second display area 1202.

According to various embodiments, when the electronic device 101 is in the folded state (e.g., FIG. 10), the first housing 1310 and the second housing 1320 may be disposed to face each other. The surface of the first display area 1201 and the surface of the second display area 1202 of the flexible display 1200 may be angled at a small angle (e.g., an angle between 0 degrees and about 10 degrees) therefrom while facing each other. At least a portion of the folding area 1203 may have a curved surface with a predetermined curvature.

According to various embodiments, when the electronic device 101 is in the intermediate state (not shown), the first housing 1310 and the second housing 1320 may be disposed at a certain angle therebetween. The surface of the first display area 1201 of the flexible display 1200 and the surface of the second display area 1202 may form an angle which is larger than the angle in the folded state (e.g., FIG. 10) and smaller than the angle in the unfolded state (e.g., FIG. 9). The folding area 1203 may at least partially have a curved surface with a predetermined curvature and, in this case, the curvature may be smaller than that when it is in the folded state.

According to various embodiments, the electronic device 101 may include an in-folding type or an out-folding type. The in-folding type may mean a state in which the flexible display 1200 is not exposed to the outside in the fully folded state. As another example, it may mean a state in which the flexible display 1200 is folded in the front direction. The out-folding type may mean a state in which the flexible display 1200 is visually exposed to the outside in the fully folded state. As another example, it may mean a state in which the flexible display 1200 is folded in the rear direction.

FIG. 11 is an exploded perspective view illustrating a foldable electronic device according to various embodiments of the disclosure.

Referring to FIG. 11, the electronic device 101 may include a foldable housing 1300, a flexible display 1200, and a printed circuit board 1360. The foldable housing 1300 may include a first housing 1310, a second housing 1320, a bracket assembly 1350, a first rear cover 1380, a second rear cover 1390, and a hinge structure 1302. The foldable housing 1300 may include a first housing 1310, a second housing 1320, a first rear cover 1380, a second rear cover 1390, a bracket assembly 1350, and/or a hinge structure 1302.

According to various embodiments, the flexible display 1200 may include a display panel 1280 and at least one support plate 1250 on which the display panel 280 is seated. In an embodiment, the support plate 1250 may be disposed between the display panel 1280 and the bracket assembly 1350. The support plate 1250 may be disposed between the display panel 1280 and the bracket assembly 1350. According to some embodiments (not shown), an adhesive structure (not shown) may be disposed between the support plate 1250 and the bracket assembly 1350 and adhere the support plate 1250 with the bracket assembly 1350.

According to an embodiment, the display panel 1280 may include a first display area 1201 (e.g., the first display area 1201 of FIG. 9) disposed on the first housing 1310, a second display area 1202 (e.g., the second display area 1202) disposed on the second housing 1320, and/or a folding area 1203 (e.g., the folding area 1203 of FIG. 9) connecting the first display area 1201 and the second display area 1202.

According to various embodiments, the bracket assembly 1350 may include a first mid plate 1352 and a second mid plate 1354. The hinge structure 1302 may be disposed between the first mid plate 1352 and the second mid plate 1354. When viewed from the outside, the hinge structure 1302 may be covered by a hinge cover (e.g., the hinge cover 1330 of FIG. 10). According to an embodiment, a printed circuit board (e.g., a flexible printed circuit board (FPCB)) crossing the first mid plate 1352 and the second mid plate 1354 may be disposed on the bracket assembly 1350.

According to various embodiments, the printed circuit board 1360 may include a first circuit board 1362 disposed on the first mid plate 1352 and a second circuit board 1364 disposed on the second mid plate 1354. The first circuit board 1362 and the second circuit board 1364 may be disposed in a space formed by the bracket assembly 1350, the first housing 1310, the second housing 1320, the first rear cover 1380, and the second rear cover 1390. Components for implementing various functions of the electronic device 101 may be disposed on the first circuit board 1362 and the second circuit board 1364.

According to various embodiments, the first housing 1310 and the second housing 1320 may be assembled together to be coupled to two opposite sides of the bracket assembly 1350, with the flexible display 1200 coupled to the bracket assembly 1350. According to an embodiment, the first housing 1310 may include a first side member 1311 at least partially surrounding the side surface of the first mid plate 1352, and the second housing 1320 may include a second side member 1321 at least partially surrounding the side surface of the second mid plate 1354. The first housing 1310 may include a first rotation supporting surface 1312, and the second housing 1320 may include a second rotation supporting surface 1322 corresponding to the first rotation supporting surface 1312. The first rotation supporting surface 1312 and the second rotation supporting surface 1322 may include a curved surface corresponding to a curved surface included in the hinge cover 1330.

According to an embodiment, the first rotation supporting surface 1312 and the second rotation supporting surface 1322, in the unfolded state of the electronic device 101 (e.g., the electronic device of FIG. 9), may cover the hinge cover 1330, allowing the hinge cover 1330 to be not or minimally exposed through the rear surface of the electronic device 101. As another example, the first rotation supporting surface 1312 and the second rotation supporting surface 1322, in the folded state of the electronic device 101 (e.g., the electronic device of FIG. 10), may rotate along the curved surface included in the hinge cover 1330, allowing the hinge cover 1330 to be maximally exposed through the rear surface of the electronic device 101.

Figure 12A:
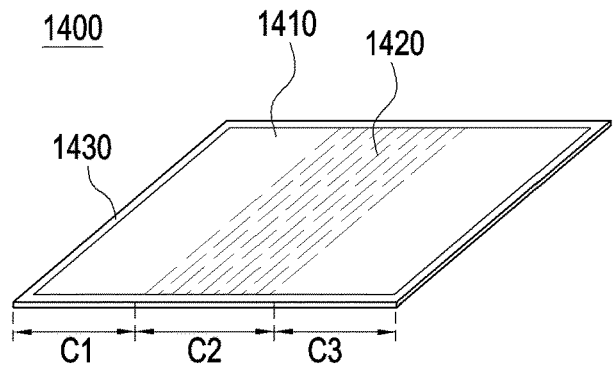
FIG. 12A is a view illustrating a heat dissipation structure in an extended state according to various embodiments of the disclosure.
Figure 12B:
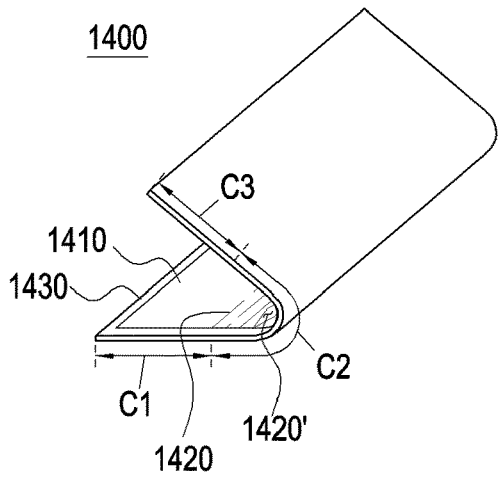
FIG. 12B is a view illustrating a heat dissipation structure with at least a portion bent according to various embodiments of the disclosure.
Figure 12C:
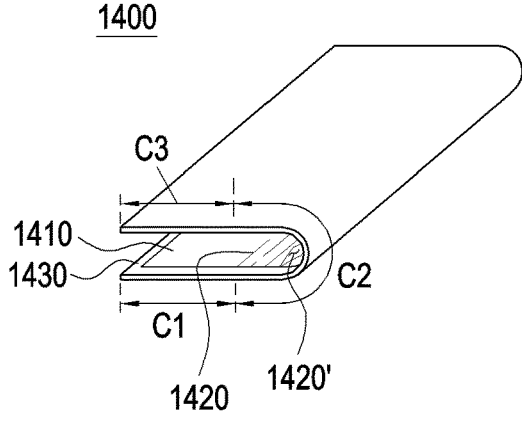
FIG. 12C is a view illustrating a heat dissipation structure with at least a portion bent according to various embodiments of the disclosure.

FIG. 12A is a view illustrating a heat dissipation structure in an extended state according to various embodiments of the disclosure. FIG. 12B is a view illustrating a heat dissipation structure with at least a portion bent according to various embodiments of the disclosure. FIG. 12C is a view illustrating a heat dissipation structure with at least a portion bent according to various embodiments of the disclosure. For example, FIG. 12A shows a shape and/or placement of the heat dissipation structure in an unfolded state of the electronic device (e.g., the opened state of the electronic device 101 of FIG. 9), and FIG. 12C shows a shape and/or placement of the heat dissipation structure in a folded state of the electronic device (e.g., the closed state of the electronic device 101 of FIG. 10). For example, the shape and/or placement of the heat dissipation structure of FIG. 12B may be an intermediate state in which the heat dissipation structure changes from the unfolded state of FIG. 12A to the folded state of FIG. 12C or an intermediate state in which the heat dissipation structure changes from the folded state of FIG. 12C to the unfolded state of FIG. 12A.

Referring to FIGS. 12A to 12C, according to various embodiments of the disclosure, the heat dissipation structure 1400 may include a heat dissipation sheet 1410, a slit structure 1420, and/or a supporting member 1430.

According to various embodiments, the heat dissipation sheet 1410 may be configured to receive the heat generated from the electrical component (not shown) (e.g., the printed circuit board 1360 of FIG. 11) disposed in the housing (not shown) (e.g., the first housing 1310 of FIG. 11 and/or the second housing 1320 of FIG. 11). For example, the heat dissipation sheet 1410 may receive the heat generated from the electrical component and diffuse the received heat to the surface in the surface direction of the heat dissipation sheet 1410. According to various embodiments, the heat dissipation sheet 1410 may include a flexible material. According to an embodiment, the heat dissipation sheet 1410 may include a sheet member including at least one of a Cu sheet, a graphite sheet, or a metal sheet, a protective film configured to protect the sheet member, and an adhesive configured to attach the sheet member and the protective film. As an example, the protective film may include at least one of a polyethylene terephthalate (PET) film, a thermoplastic polyurethane (TPU) film, or a urethane film. The adhesive may include at least one of an acrylic resin, a silicone resin, a styrene resin, a polyester resin, a rubber resin, or a urethane resin. According to some embodiments, the heat dissipation sheet 1410 may include various means or materials capable of receiving heat from an electrical component and diffusing the heat in the surface direction of the heat dissipation sheet 1410.

According to various embodiments, the heat dissipation sheet 1410 may include a first fixed area C1 facing the first display area (not shown) (e.g., the first display area 1201 of FIG. 11), a second fixed area C3 facing the second display area (not shown) (e.g., the second display area 1202 of FIG. 11), and/or a bending area C2 facing the folding area (not shown) (e.g., the folding area 1203 of FIG. 11).

According to various embodiments, the first fixed area C1 may have at least a portion disposed between the first display area (not shown) (e.g., the first display area 1201 of FIG. 11) and the first housing (not shown) (e.g., the first housing 1310 of FIG. 11). According to an embodiment, the first fixed area C1 may have at least a portion disposed between the first display area (not shown) (e.g., the first display area 1201 of FIG. 11) and the first mid plate (not shown) (e.g., the first mid plate 1352 of FIG. 11) of the bracket assembly (not shown) (e.g., the bracket assembly 1350 of FIG. 11). According to an embodiment, the first fixed area C1 may have at least a portion disposed between the first display area (not shown) (e.g., the first display area 1201 of FIG. 11) and the support plate (not shown) (e.g., the support plate 1250 of FIG. 11). For example, the first fixed area C1 may have a fixed position with respect to the first mid plate (not shown) (e.g., the first mid plate 1352 of FIG. 11).

According to various embodiments, the second fixed area C3 may have at least a portion disposed between the second display area (not shown) (e.g., the second display area 1202 of FIG. 11) and the second housing (not shown) (e.g., the second housing 1320 of FIG. 11). According to an embodiment, the second fixed area C3 may have at least a portion disposed between the second display area (not shown) (e.g., the second display area 1202 of FIG. 11) and the second mid plate (not shown) (e.g., the second mid plate 1354 of FIG. 11) of the bracket assembly (not shown) (e.g., the bracket assembly 1350 of FIG. 11). According to an embodiment, the second fixed area C3 may have at least a portion disposed between the second display area (not shown) (e.g., the second display area 1202 of FIG. 11) and the support plate (not shown) (e.g., the support plate 1250 of FIG. 11). For example, the second fixed area C3 may have a fixed position with respect to the second mid plate (not shown) (e.g., the second mid plate 1354 of FIG. 11).

According to various embodiments, the bending area C2 may have at least a portion disposed between the folding area (not shown) (e.g., the folding area 1203 of FIG. 11) and the bracket assembly (not shown) (e.g., the bracket assembly 1350 of FIG. 11). According to an embodiment, the bending area C2 may have at least a portion disposed between the folding area (not shown) (e.g., the folding area 1203 of FIG. 11) and the hinge structure (not shown) (e.g., the hinge structure 1302 of FIG. 11). For example, the bending area C2 may be folded or unfolded together with the folding area (not shown) (e.g., the folding area 1203 of FIG. 11).

According to various embodiments, the slit structure 1420 may be configured to supplement (or receive) deformation of the bending area C2. According to an embodiment, the slit structure 1420 may be formed in at least a portion of the bending area C2. According to an embodiment, at least a portion of the slit structure 1420 may extend along a first direction substantially parallel to, or forming an acute angle with, the folding axis (not shown) (e.g., the folding axis A of FIG. 9).

According to various embodiments, the slit structure 1420 may have a slit shape penetrating the upper and lower surfaces of the heat dissipation sheet 1410. According to an embodiment, there may be provided a plurality of slit structures 1420, and two adjacent slit structures 1420 may be disposed parallel to each other or together on a virtual straight line. The plurality of slit structures 1420 may be disposed to cross each other as shown, but without limitations thereto, may be disposed in other various shapes. According to an embodiment, the slit structure 1420 may supplement (or receive) the extension or contraction of at least a portion (e.g., the bending area C2) of the heat dissipation sheet 1410.

According to various embodiments, the supporting member 1430 may support at least a portion of the heat dissipation sheet 1410. According to an embodiment, the supporting member 1430 may support one surface of the heat dissipation sheet 1410 (e.g., one surface facing opposite to the surface facing the display 1200 of FIG. 11, of the heat dissipation sheet 1410). According to an embodiment, the supporting member 1430 may have a panel shape with a recess or the heat dissipation sheet 1410 may be stacked on the recess of the supporting member 1430. According to another embodiment, the supporting member 1430 may have a panel shape with no recess, and the heat dissipation sheet 1410 may be stacked on one surface (e.g., the surface facing the display 1200 of FIG. 11) of the supporting member 1430. In some embodiments, the heat dissipation sheet 1410 may be interpreted as stacked on the upper surface (e.g., the surface facing the display 1200 of FIG. 11) of the supporting member 1430. According to an embodiment, the supporting member 1430 may include a flexible material. According to some embodiments, the supporting member 1430 may have various structures capable of stacking of the heat dissipation sheet 310 and supporting the display (not shown) (e.g., the display 1200 of FIG. 11). According to an embodiment, the supporting member 1430 may be attached and/or coupled to the rear surface (or inner surface) (e.g., the face facing the first mid plate 1352 and/or second mid plate 1354 of FIG. 11) of the display (not shown) (e.g., the display 1200 of FIG. 11), be attached and/or coupled to the first mid plate (not shown) (e.g., the first mid plate 1352 and/or the second mid plate 1354 of FIG. 11) configured to support the display (not shown) (e.g., the display 1200 of FIG. 11), or be attached and/or coupled to the hinge structure (not shown) (e.g., the hinge structure 1302 of FIG. 11). According to some embodiments, the supporting member 1430 may be attached and/or coupled to various components or be disposed in various positions to be able to support the display (not shown) (e.g., the display 1200 of FIG. 11). According to some embodiments, the supporting member 1430 may include a metal material including at least one of Cu, SUS, Al, or Mg and/or a non-metal material including at least one of polycarbonate (PC), polyamide (PA), polybutylene terephthalate (PBA), or polymer.

According to an embodiment, the supporting member 1430 may be disposed within a housing (not shown) (e.g., the first housing 1310 of FIG. 11 and/or the second housing 1320 of FIG. 11), and at least a portion thereof may support the display (not shown) (e.g., the display 1200 of FIG. 11). For example, the supporting member 1430 may support an inner surface (e.g., the surface facing the bracket assembly 1350 of FIG. 11) of the display (not shown) (e.g., the display 1200 of FIG. 11). According to an embodiment, the supporting member 1430 may have a portion (e.g., the portion supporting the first fixed area C1) coupled and/or connected to the first mid plate (not shown) (e.g., the first mid plate 1352 of FIG. 11), and the supporting member 1430 may have another portion (e.g., the portion supporting the second fixed area C3) coupled and/or connected to the second mid plate (not shown) (e.g., the second mid plate 1354 of FIG. 11). According to an embodiment, the supporting member 1430 may have another portion (e.g., the portion supporting the bending area C2) coupled and/or connected to the inner portion of the first mid plate (not shown) (e.g., the first mid plate 1352 of FIG. 11) and/or the second mid plate (not shown) (e.g., the second mid plate 1354 of FIG. 11), and the supporting member 1430 may have another portion (e.g., the portion supporting the bending area C2) folded or unfolded along with the folding area (not shown) (e.g., the folding area 1203 of FIG. 11). According to an embodiment, the supporting member 1430 may be interpreted as some components of the heat dissipation structure 1400. According to another embodiment, the supporting member 1430 may be interpreted as a separate component from the heat dissipation structure 1400.

Described with reference to FIGS. 12A to 12C is described the operation and/or deformation of the heat dissipation structure 1400 when the electronic device (not shown) (e.g., the electronic device 101 of FIGS. 2 to 4) moves from the unfolded state to the folded state.

Referring to FIG. 12A, in the unfolded state (e.g., the unfolded state of the electronic device 101 of FIG. 9) of the electronic device, the first fixed area C1, the second fixed area C3, and the bending area C2 in the heat dissipation structure 1400 may form substantially flat surfaces. In an embodiment, in the unfolded state of the electronic device, the first fixed area C1, the bending area C2, and/or the third fixed area C3 may receive the heat generated from the battery (not shown) (e.g., the battery 189 of FIG. 1) and/or the printed circuit board 1360 and diffuse the received heat in the surface direction of the first fixed area C1 and/or the third fixed area C3 or the surface direction of the heat dissipation sheet 1410.

For example, when the electronic device moves from the unfolded state to the folded state, the heat dissipation structure 1400 may change from the placement and/or shape as shown in FIG. 12A through the placement and/or shape as shown in FIG. 12B to the placement and/or shape as shown in FIG. 12C.

Referring to FIGS. 12B and/or 12C, when the electronic device moves from the unfolded state to the folded state, at least a portion of the bending area C2 in the heat dissipation sheet 1410 may be bent. For example, at least a portion (e.g., the bending area C2 and the portion of the supporting member 1430, supporting the bending area C2) of the heat dissipation structure 1400, along with the electronic device (not shown) (e.g., the electronic device 101 of FIG. 11), may be folded about the folding axis (not shown) (e.g., the folding axis A of FIG. 9). Of the bending area C2, the portion facing the folding area (not shown) (e.g., the folding area 1203 of FIG. 11) may be bent. In this case, the area of the bending area C2 may be expanded. For example, the folding area (not shown) may be rotated and/or folded about the folding axis (not shown) (e.g., the folding axis A of FIG. 9) while forming a certain first radius of curvature. In this case, the portion of the bending area C2, facing the folding area (not shown) (e.g., the folding area 1203 of FIG. 11), may be rotated and/or folded about the folding axis (not shown) (e.g., the folding axis A of FIG. 9) while forming a second radius of curvature, larger than the first radius of curvature. Accordingly, since the portion of the bending area C2 is rotated and/or folded about the folding axis (not shown) (e.g., the folding axis A of FIG. 9) to be larger than the portion of the folding area 1203 corresponding to the portion of the bending area C2, the bending area B1 may increase in area. For example, in the state (e.g., the unfolded state (e.g., FIG. 9)) as shown in FIG. 12A, the distance of the slit structures 1420 disposed adjacent and parallel to each other (or distance (width) on the surface of the heat dissipation sheet 1410) may be a first distance. For example, in the state as shown in FIG. 12B (e.g., an intermediate state in the middle of moving from the unfolded state (e.g., FIG. 9) to the folded state (e.g., FIG. 10)) and/or the state as shown in FIG. 12C (e.g., the folded state (e.g., FIG. 10), the distance of at least some of the slit structures 1420 (e.g., the slit structures 1420' in the bending portion) disposed adjacent and parallel to each other (or the distance (width) on the surface of the heat dissipation sheet 1410) may be a second distance larger than the first distance. If the slit structures 1420 are not formed in the heat dissipation sheet 1410, at least a portion of the bending area C2 may be weakened and torn or cracked as extension and/or contraction of the bending area C2 is repeated. According to an embodiment, when the bending area C2 is extended, the slit structures 1420 disposed in the extending bending area C2 may be expanded, bearing the extension of the bending area C2. According to an embodiment, when the bending area C2 is shrunken, the slit structures 1420 disposed in the shrunken bending area C2 are contracted, bearing the shrinkage of the bending area C2. In the folded state (e.g., the folded state of the electronic device 101 of FIG. 10) of the electronic device, the heat dissipation structure 1400 may be disposed as shown in FIG. 12C.

According to some embodiments (not shown), the slit structure 1420 of the heat dissipation structure 1400 may be expanded in the unfolded state of the electronic device (not shown) and be contracted in the folded state of the electronic device (not shown).

Figure 13A:
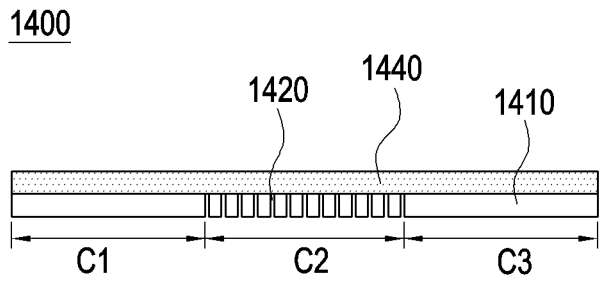
FIG. 13A is a view illustrating a heat dissipation structure in an extended state according to various embodiments of the disclosure.
Figure 13B:
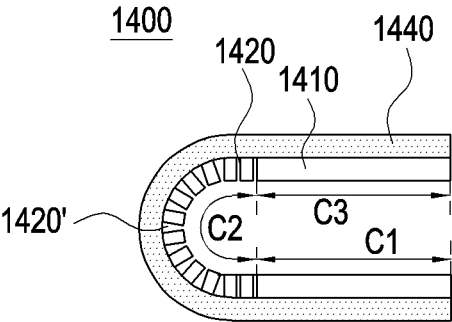
FIG. 13B is a view illustrating a heat dissipation structure with at least a portion bent according to various embodiments of the disclosure.

FIG. 13A is a view illustrating a heat dissipation structure in an extended state according to various embodiments of the disclosure. FIG. 13B is a view illustrating a heat dissipation structure with at least a portion bent according to various embodiments of the disclosure.

Referring to FIGS. 13A and/or 13B, according to various embodiments of the disclosure, a heat dissipation structure 1400 (e.g., the heat dissipation structure 1400 of FIGS. 12A to 12C) may include a heat dissipation sheet 1410, a slit structure 1420, and/or an elastic member 1440.

The configuration of the heat dissipation structure 1400, the heat dissipation sheet 1410 and/or the slit structure 1420 of FIGS. 13A and/or 13B may be identical in whole or part to the configuration of the heat dissipation structure 1400, the heat dissipation sheet 1410, and/or the slit structure 1420 of FIGS. 12A, 12B, and/or 12C.

According to various embodiments, the heat dissipation sheet 1410 (e.g., the heat dissipation sheet 1410 of FIGS. 12A to 12C) may include a first fixed area C1 (e.g., the first fixed area C1 of FIGS. 12A to 12C), a bending area C2 (e.g., the bending area C2 of FIGS. 12A to 12C), and/or a second fixed area C3 (e.g., the fixed area C3 of FIGS. 12A to 12C).

According to various embodiments, the slit structure 1420 (e.g., the slit structure 1420 of FIGS. 12A to 12C) may be formed in at least one portion of the bending area C2.

According to various embodiments, the elastic member 1440 may be stacked on one surface of the heat dissipation sheet 1410. According to an embodiment, the elastic member 1440 may be bent together with the bending area C2 of the heat dissipation sheet 1410. According to an embodiment, when the bending area C2 is bent, at least some 1420' of the slit structures 1420 may be bent together with the bending area C2. According to an embodiment, the elastic member 1440 may provide an elastic restorative force to the bending area C2 when the bending area C2 of the heat dissipation sheet 1410 is extended. According to an embodiment, the elastic member 1440 may be stacked on the surface of the heat dissipation sheet 1410, which faces the display (not shown) (e.g., the display 1200 of FIG. 11). According to an embodiment, the elastic member 1440 may be formed by impregnating (or injecting) or thermocompressing a molecular filler including at least one of graphite or boron nitride with thermal conductivity and a compound including at least one of thermoplastic polyurethane, rubber, or silicone having elasticity, to a green sheet. According to some embodiments, the elastic member 1440 may include various means capable of providing an elastic restorative force to the heat dissipation sheet 1410. According to the illustrated embodiment, the elastic member 1440 may be stacked on one surface of the heat dissipation sheet 1410 (e.g., the surface facing the display 1200 of FIG. 11). According to some embodiments (not shown), the elastic member 1440 may be stacked on another surface (e.g., the surface facing the first mid plate 1352 and/or second mid plate 1354 of FIG. 11) opposite to the surface (e.g., the surface facing the display 1200 of FIG. 11) of the heat dissipation sheet 1410. In an embodiment, as the elastic member 1440 includes a molecular filler having thermal conductivity, it is possible to supplement the thermal conductivity of the portion with the slit structures 1420 of the heat dissipation sheet 1410.

Figure 14A:
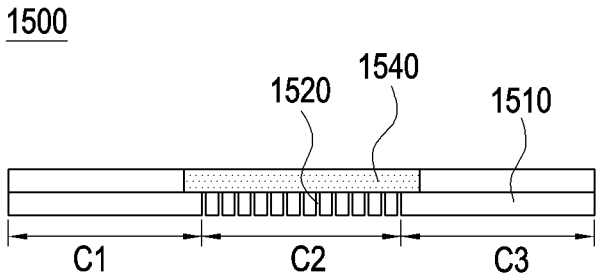
FIG. 14A is a view illustrating a heat dissipation structure in an extended state according to various embodiments of the disclosure.
Figure 14B:
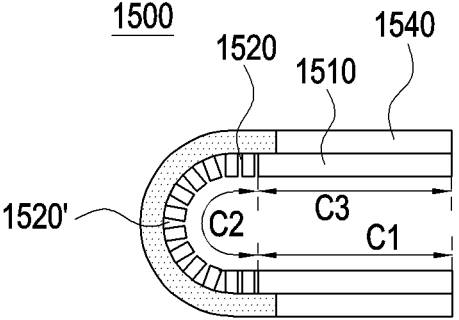
FIG. 14B is a view illustrating a heat dissipation structure with at least a portion bent according to various embodiments of the disclosure.

FIG. 14A is a view illustrating a heat dissipation structure in an extended state according to various embodiments of the disclosure. FIG. 14B is a view illustrating a heat dissipation structure with at least a portion bent according to various embodiments of the disclosure.

Referring to FIGS. 14A and/or 14B, a heat dissipation structure 1500 (e.g., the heat dissipation structure 1400 of FIGS. 12A to 12C) may include a heat dissipation sheet 1510, a slit structure 1520, and/or an elastic member 1540.

Referring to FIGS. 14A and/or 14B, according to various embodiments of the disclosure, a heat dissipation structure 1500 (e.g., the heat dissipation structure 1400 of FIGS. 12A to 12C) may include a heat dissipation sheet 1510, a slit structure 1520, and/or an elastic member 1540.

The configuration of the heat dissipation structure 1500, the heat dissipation sheet 1510 and/or the slit structure 1520 of FIGS. 14A and/or 14B may be identical in whole or part to the configuration of the heat dissipation structure 1400, the heat dissipation sheet 1410, and/or the slit structure 1420 of FIGS. 12A, 12B, and/or 12C.

According to various embodiments, the heat dissipation sheet 1510 (e.g., the heat dissipation sheet 1410 of FIGS. 12A to 12C) may include a first fixed area (e.g., the first fixed area C1 of FIGS. 12A to 12C), a bending area C2 (e.g., the bending area C2 of FIGS. 12A to 12C), and/or a second fixed area C3 (e.g., the second fixed area C3 of FIGS. 12A to 12C).

According to various embodiments, the slit structure 1520 (e.g., the slit structure 1420 of FIGS. 12A to 12C) may be formed in at least one portion of the bending area C2.

According to various embodiments, the elastic member 1540 may be stacked on one surface of the heat dissipation sheet 1510. According to an embodiment, the elastic member 1540 may be stacked on one surface of the bending area C2. According to an embodiment, the elastic member 1540 may be bent together with the bending area C2 of the heat dissipation sheet 1510. According to an embodiment, when the bending area C2 is bent, at least some 1520' of the slit structures 1520 may be bent together with the bending area C2. According to an embodiment, the elastic member 1540 may provide an elastic restorative force to the bending area C2 when the bending area C2 of the heat dissipation sheet 1510 is extended. According to an embodiment, the elastic member 1540 may be stacked on the surface of the bending area C2 of the heat dissipation sheet 1510, which faces the display (not shown) (e.g., the display 1200 of FIG. 11). According to an embodiment, the elastic member 1540 may be formed by impregnating (or injecting) or thermocompressing a molecular filler including at least one of graphite or boron nitride with thermal conductivity and a compound including at least one of thermoplastic polyurethane, rubber, or silicone having elasticity, to a green sheet. According to some embodiments, the elastic member 1540 may include various means capable of providing an elastic restorative force to the heat dissipation sheet 1510. According to the illustrated embodiment, the elastic member 1540 may be stacked on one surface of the portion where the slit structure 1520 is formed (e.g., the surface facing the display 1200 of FIG. 11) in the heat dissipation sheet 1510. According to some embodiments (not shown), the elastic member 1540 may be stacked on another surface (e.g., the surface facing the first mid plate 1352 of FIG. 11 and/or second mid plate 1354 of FIG. 11) opposite to the surface (e.g., the surface facing the display 1200 of FIG. 11) of the portion where the slit structure 1520 is formed in the heat dissipation sheet 1510. In an embodiment, as the elastic member 1540 includes a molecular filler having thermal conductivity, it is possible to supplement the thermal conductivity of the portion with the slit structures 1520 of the heat dissipation sheet 1510.

Figure 15A:
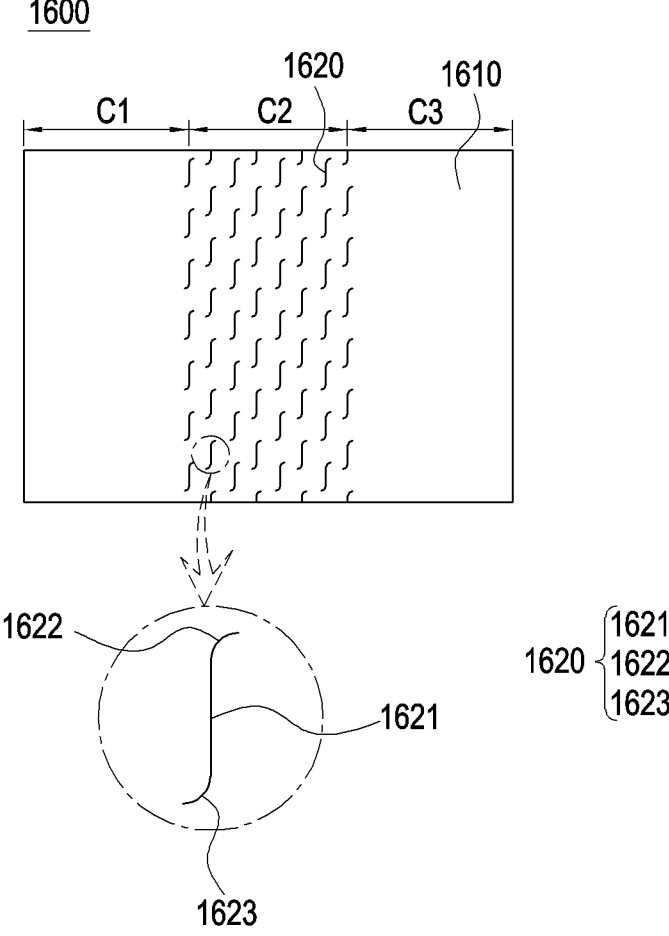
FIG. 15A is a view illustrating a heat dissipation structure according to various embodiments of the disclosure.

FIG. 15A is a view illustrating a heat dissipation structure according to various embodiments of the disclosure.

Referring to FIG. 15A, a heat dissipation structure 1600 (e.g., the heat dissipation structure 1400 of FIGS. 12A to 12C) may include a heat dissipation sheet 1610 and/or a slit structure 1620.

The configuration of the heat dissipation structure 1600, the heat dissipation sheet 1610 and/or the slit structure 1620 of FIG. 15A may be identical in whole or part to the configuration of the heat dissipation structure 1400, the heat dissipation sheet 1410, and/or the slit structure 1420 of FIGS. 12A to 12C.

According to various embodiments, the heat dissipation sheet 1610 may include a first fixed area C1 (e.g., the first fixed area C1 of FIGS. 12A to 12C), a bending area C2 (e.g., the bending area C2 of FIGS. 12A to 12C), and/or a second fixed area C3 (e.g., the second fixed area C3 of FIGS. 12A to 12C).

According to various embodiments, the slit structure 1620 (e.g., the slit structure 1420 of FIGS. 12A to 12C) may be formed in at least one portion of the bending area C2. According to various embodiments, at least a portion of the slit structure 1620 may extend along a first direction substantially parallel to, or forming an acute angle with, the folding axis (not shown) (e.g., the folding axis A of FIG. 9).

According to various embodiments, the slit structure 1620 may include a first portion 1621, a second portion 1622 formed at one end of the first portion 1621, and/or a third portion 1623 formed at the other end of the first portion 1621.

According to an embodiment, the first portion 1621 may extend along a first direction substantially parallel to, or forming an acute angle with, the folding axis (not shown) (e.g., the folding axis A of FIG. 9). According to an embodiment, the first portion 1621 may have a slit shape penetrating the upper and lower surfaces of the bending area C2 and bear the extension and/or contraction of the bending area C2. According to an embodiment, the first portion 1621 and its adjacent first portion 1621 may be disposed together on a virtual straight line or may be disposed parallel to each other.

According to an embodiment, the second portion 1622 may be formed at one end of the first portion 1621 and at least a portion thereof may include a curved shape. According to an embodiment, the second portion 1622 may extend in a second direction inclined from the first direction which is the extending direction of the first portion. According to an embodiment, the second portion 1622 may have a slit shape penetrating the upper and lower surfaces of the bending area C2 and bear the extension and/or contraction of the bending area C2.

According to an embodiment, the third portion 1623 may be formed at the other end of the first portion 1621 and at least a portion thereof may include a curved shape. According to an embodiment, the third portion 1623 may extend in a third direction inclined from the first direction which is the extending direction of the first portion. In an embodiment, the third direction may be a direction opposite to the second direction. According to an embodiment, the third portion 1623 may have a slit shape penetrating the upper and lower surfaces of the bending area C2 and bear the extension and/or contraction of the bending area C2.

Figure 15B:
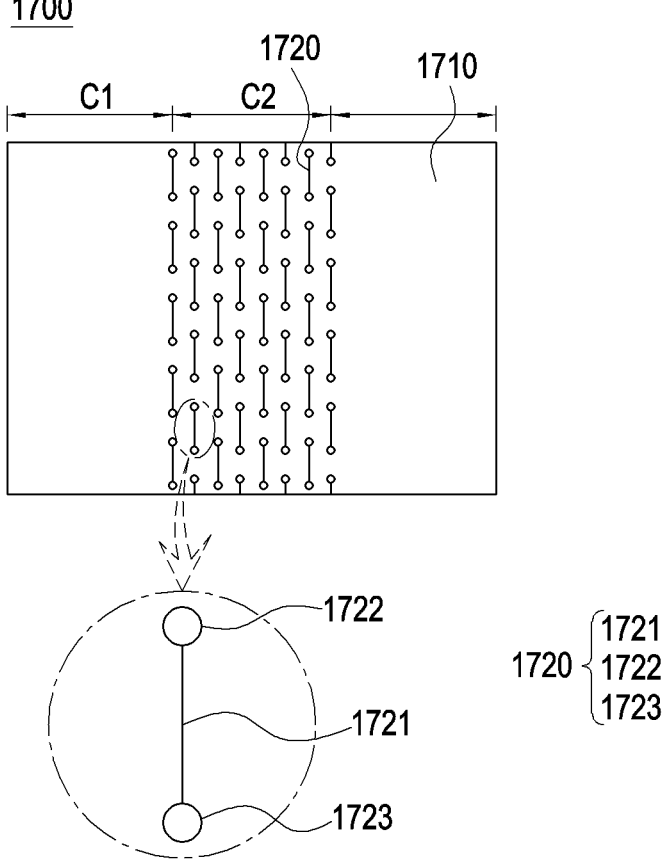
FIG. 15B is a view illustrating a heat dissipation structure according to various embodiments of the disclosure.

FIG. 15B is a view illustrating a heat dissipation structure according to various embodiments of the disclosure.

Referring to FIG. 15B, a heat dissipation structure 1700 (e.g., the heat dissipation structure 1400 of FIGS. 12A to 12C) may include a heat dissipation sheet 1710 and/or a slit structure 1720.

The configuration of the heat dissipation structure 1700, the heat dissipation sheet 1710 and/or the slit structure 1720 of FIG. 15B may be identical in whole or part to the configuration of the heat dissipation structure 1400, the heat dissipation sheet 1410, and/or the slit structure 1420 of FIGS. 12A to 12C.

According to various embodiments, the heat dissipation sheet 1710 may include a first fixed area C1 (e.g., the first fixed area C1 of FIGS. 12A to 12C), a bending area C2 (e.g., the bending area C2 of FIGS. 12A to 12C), and/or a second fixed area C3 (e.g., the second fixed area C3 of FIGS. 12A to 12C).

According to various embodiments, the slit structure 1720 (e.g., the slit structure 1420 of FIGS. 12A to 12C) may be formed in at least one portion of the bending area C2. According to various embodiments, at least a portion of the slit structure 1720 may extend along a first direction substantially parallel to, or forming an acute angle with, the folding axis (not shown) (e.g., the folding axis A of FIG. 9).

According to various embodiments, the slit structure 1720 may include a first portion 1721, a second portion 1722 formed at one end of the first portion 1721, and/or a third portion 1723 formed at the other end of the first portion 1721.

According to an embodiment, the first portion 1721 may extend along a first direction substantially parallel to, or forming an acute angle with, the folding axis (not shown) (e.g., the folding axis A of FIG. 9). According to an embodiment, the first portion 1721 may have a slit shape penetrating the upper and lower surfaces of the bending area C2 and bear the extension and/or contraction of the bending area C2. According to an embodiment, the first portion 1721 and its adjacent first portion 1721 may be disposed together on a virtual straight line or may be disposed parallel to each other.

According to an embodiment, the second portion 1722 may be formed at one end of the first portion 1721 and at least a portion thereof may include a circular shape. According to an embodiment, the second portion 1722 may have a hole shape penetrating the upper and lower surfaces of the bending area C2 and having a predetermined diameter and bear the extension and/or contraction of the bending area C2.

According to an embodiment, the third portion 1723 may be formed at the other end of the first portion 1721 and at least a portion thereof may include a circular shape. According to an embodiment, the third portion 1723 may have a hole shape penetrating the upper and lower surfaces of the bending area C2 and having a predetermined diameter and bear the extension and/or contraction of the bending area C2.

Figure 15C:
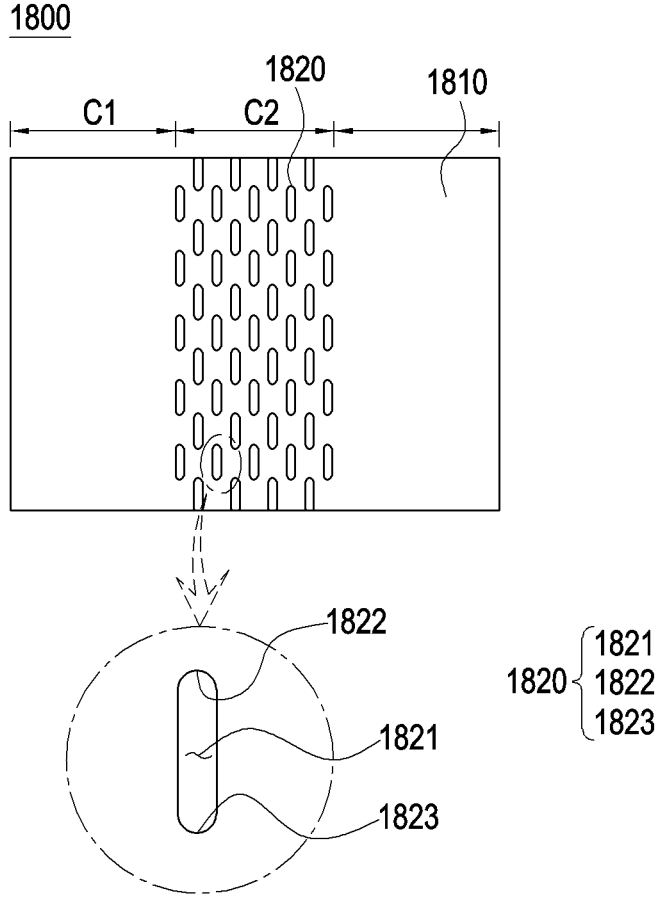
FIG. 15C is a view illustrating a heat dissipation structure according to various embodiments of the disclosure.

FIG. 15C is a view illustrating a heat dissipation structure according to various embodiments of the disclosure.

Referring to FIG. 15C, a heat dissipation structure 1800 (e.g., the heat dissipation structure 1400 of FIGS. 12A to 12C) may include a heat dissipation sheet 1810 and/or a slit structure 1820.

The configuration of the heat dissipation structure 1800, the heat dissipation sheet 1810 and/or the slit structure 1820 of FIG. 15C may be identical in whole or part to the configuration of the heat dissipation structure 1400, the heat dissipation sheet 1410, and/or the slit structure 1420 of FIGS. 12A to 12C.

According to various embodiments, the heat dissipation sheet 1810 may include a first fixed area C1 (e.g., the first fixed area C1 of FIGS. 12A to 12C), a bending area C2 (e.g., the bending area C2 of FIGS. 12A to 12C), and/or a second fixed area C3 (e.g., the second fixed area C3 of FIGS. 12A to 12C).

According to various embodiments, the slit structure 1820 (e.g., the slit structure 1420 of FIGS. 12A to 12C) may be formed in at least one portion of the bending area C2. According to various embodiments, at least a portion of the slit structure 1820 may extend along a first direction substantially parallel to, or forming an acute angle with, the folding axis (not shown) (e.g., the folding axis A of FIG. 9).

According to various embodiments, the slit structure 1820 may include a first portion 1821, a second portion 1822 formed at one end of the first portion 1821, and/or a third portion 1823 formed at the other end of the first portion 1821.

According to an embodiment, the first portion 1821 may extend along a first direction substantially parallel to, or forming an acute angle with, the folding axis (not shown) (e.g., the folding axis A of FIG. 9). According to an embodiment, the first portion 1821 may have an opening shape penetrating the upper and lower surfaces of the bending area C2 and extending in a first direction and bear the extension and/or contraction of the bending area C2. According to an embodiment, the first portion 1821 and its adjacent first portion 1821 may be disposed together on a virtual straight line or may be disposed parallel to each other.

According to an embodiment, the second portion 1822 may be formed at one end of the first portion 1821 and at least a portion thereof may include a semi-circular shape. According to an embodiment, the second portion 1822 may have a semi-circular hole shape penetrating the upper and lower surfaces of the bending area C2 and having a predetermined diameter and bear the extension and/or contraction of the bending area C2.

According to an embodiment, the third portion 1823 may be formed at the other end of the first portion 1821 and at least a portion thereof may include a semi-circular shape. According to an embodiment, the third portion 1823 may have a semi-circular hole shape penetrating the upper and lower surfaces of the bending area C2 and having a predetermined diameter and bear the extension and/or contraction of the bending area C2.

According to various embodiments of the disclosure, an electronic device (e.g., the electronic device 101 of FIG. 1 or the electronic device 101 of FIG. 2) may comprise a housing including a first housing (e.g., the first housing 201 of FIG. 3) and a second housing (e.g., the second housing 202 of FIG. 3) for guiding a sliding movement of the first housing, a display (e.g., the display 203 of FIG. 3) having at least a portion configured to be unfolded based on the sliding movement of the first housing and including a first display area (e.g., the first display area A1 of FIG. 3) disposed on the first housing and a second display area (e.g., the second display area A2 of FIG. 3) extending from the first display area, an electrical component (e.g., the battery 189 of FIG. 1, the battery 289 of FIG. 4, the main circuit board 204 of FIG. 4, or the sub circuit board 290 of FIG. 4) disposed in the housing, a heat dissipation sheet (e.g., the heat dissipation sheet 310 of FIG. 5A) configured to receive heat generated from the electrical component and including a bending area (e.g., the bending area B1 of FIG. 5A) facing the first display area and a fixed area (e.g., the fixed area B2 of FIG. 5A) facing the second display area, and a slit structure (e.g., the slit structure 320 of FIG. 5A) formed in at least a portion of the bending area and including at least a portion extending along a first direction inclined from a direction of the sliding movement of the first housing.

According to various embodiments, the first direction may be perpendicular to the direction of the sliding movement of the first housing.

According to various embodiments, the first direction may be a direction forming an acute angle with the direction of the sliding movement of the first housing.

According to various embodiments, the electronic device may include a plurality of slit structures. Any one of the plurality of slit structures may be disposed parallel to, or on a straight line together with, at least one adjacent slit structure.

According to various embodiments, the slit structure may include a first portion (e.g., the first portion 521 of FIG. 8A, the first portion 621 of FIG. 8B, or the first portion 721 of FIG. 8C) having at least a portion extending in the first direction, a second portion (e.g., the second portion 522 of FIG. 8A, the second portion 622 of FIG. 8B, or the second portion 722 of FIG. 8C) formed at a first end of the first portion, and a third portion (e.g., the third portion 523 of FIG. 8A, the third portion 623 of FIG. 8B, or the third portion 723 of FIG. 8C) formed at a second end of the first portion opposite the first end.

According to various embodiments, at least one of the second portion (e.g., the second portion 622 of FIG. 8B) and the third portion (e.g., the third portion 623 of FIG. 8B) may comprise a circular hole shape with a designated diameter.

According to various embodiments, at least one of the second portion (e.g., the second portion 722 of FIG. 8C) and the third portion (e.g., the third portion 723 of FIG. 8C) may comprise a semi-circular hole shape with a designated diameter.

According to various embodiments, the second portion (e.g., the second portion 522 of FIG. 8A) may extend in a second direction inclined from the first direction, and the third portion (e.g., the third portion 523 of FIG. 8A) may extend in a third direction inclined from the first direction.

According to various embodiments, the second direction and the third direction may be directions inclined to face in opposite directions with respect to the first direction.

According to various embodiments, the electronic device may further comprise an elastic member (e.g., the elastic member 340 of FIG. 6A or the elastic member 440 of FIG. 7) stacked on a surface of the heat dissipation sheet.

According to various embodiments, the elastic member may be stacked on a surface of the bending area of the heat dissipation sheet.

According to various embodiments, at least a portion of the elastic member may be disposed between the display and the heat dissipation sheet.

According to various embodiments, the electronic device may further comprise a supporting member (e.g., the supporting member 330 of FIG. 5A) coupled to a surface of the heat dissipation sheet.

According to various embodiments, the supporting member may have at least a portion configured to support the display.

According to various embodiments, at least a portion of the heat dissipation sheet may be disposed between the display and the supporting member.

According to various embodiments of the disclosure, an electronic device (e.g., the electronic device 101 of FIG. 1 or the electronic device 101 of FIG. 9) may comprise a housing including a first housing (e.g., the first housing 1310 of FIG. 9) and a second housing (e.g., the second housing 1320 of FIG. 9) providing a motion relative to the first housing, a hinge structure (e.g., the hinge structure 1302 of FIG. 11) connecting the first housing and the second housing to pivot from a folded state to an unfolded state, a flexible display (e.g., the flexible display 1200 of FIG. 9) formed to be transformed in response to the motion of the first housing relative to the second housing and including a first display area (e.g., the first display area 1201 of FIG. 9) disposed on the first housing, a second display area (e.g., the second display area 1202 of FIG. 9) disposed on the second housing, and a folding area (e.g., the folding area 1203 of FIG. 9) connecting the first display area and the second display area, an electrical component (e.g., the battery 189 of FIG. 1 or the printed circuit board 1360 of FIG. 11) disposed in the housing, a heat dissipation sheet (e.g., the heat dissipation sheet 1410 of FIG. 12A) configured to receive heat generated from the electrical component and including a first fixed area (e.g., the first fixed area C1 of FIG. 12A) facing the first display area, a second fixed area (e.g., the second fixed area C3 of FIG. 12A) facing the second display area, and a bending area (e.g., the folding area C2 of FIG. 12A) facing the folding area, and a slit structure (e.g., the slit structure 1420 of FIG. 12A) formed in at least a portion of the bending area and including at least a portion extending along a first direction parallel to, or forming an acute angle with, the folding area.

According to various embodiments, the electronic device may further comprise an elastic member (e.g., the elastic member 1440 of FIG. 13A or the elastic member 1540 of FIG. 14) stacked on a surface of the heat dissipation sheet.

According to various embodiments, the electronic device may further comprise a supporting member (e.g., the supporting member 1430 of FIG. 12A) stacked on a surface of the heat dissipation sheet.

According to various embodiments, the slit structure may include a first portion (e.g., the first portion 1621 of FIG. 15A, the first portion 1721 of FIG. 15B, or the first portion 1821 of FIG. 15C) having at least a portion extending in the first direction, a second portion (e.g., the second portion 1622 of FIG. 15A, the second portion 1722 of FIG. 15B, or the second portion 1822 of FIG. 15C) formed at a first end of the first portion, and a third portion (e.g., the third portion 1623 of FIG. 15A, the third portion 1723 of FIG. 15B, or the third portion 1823 of FIG. 15C) formed at a second end of the first portion opposite the first end.

According to various embodiments, the electronic device may include a plurality of slit structures. Any one of the plurality of slit structures may be disposed parallel to, or on a straight line together with, at least one adjacent slit structure.

According to various embodiments of the disclosure, a method for dissipating heat within an electronic device having a flexible display, the method comprising: forming (or preparing) a heat dissipation sheet having at least one fixed area and a bending area, the bending area comprising a plurality of slit structures, each slit structure comprising a slit shape penetrating upper and lower surfaces of the heat dissipation sheet; and placing the heat dissipation sheet in thermal contact with an electrical component of the electronic device; wherein the plurality of slit structures are separated by a first distance when the flexible display is in a first state; and wherein the plurality of slit structures are separated by a second distance greater than the first distance when the flexible display is in a second state.

While the disclosure has been shown and described with reference to exemplary embodiments thereof, it will be apparent to those of ordinary skill in the art that various changes in form and detail may be made thereto without departing from the spirit and scope of the disclosure as defined by the following claims.

The invention claimed is:

1. An electronic device comprising:
   a housing including a first housing and a second housing for guiding a sliding movement of the first housing;
   a display having at least a portion configured to be unfolded based on the sliding movement of the first housing and including a first display area disposed on the first housing and a second display area extending from the first display area;
   an electrical component disposed in the housing;

a heat dissipation sheet comprising a graphite sheet and configured to receive heat generated from the electrical component and including a bending area facing the first display area and a fixed area facing the second display area; and a slit structure comprising a slit shape penetrating upper and lower surfaces of the bending area, the slit structure formed in at least a portion of the bending area and including at least a first portion extending along a first direction inclined from a direction of the sliding movement of the first housing and a second portion formed at a first end of the first portion, the second portion comprising one of a circular hole shape with a designated diameter penetrating the upper and lower surfaces of the bending area and a curved shape penetrating the upper and lower surfaces of the bending area.

2. The electronic device of claim 1, wherein the first direction is a direction perpendicular to the direction of the sliding movement of the first housing.

3. The electronic device of claim 1, wherein the first direction is a direction forming an acute angle with the direction of the sliding movement of the first housing.

4. The electronic device of claim 1, wherein the electronic device includes a plurality of slit structures, and wherein any one of the plurality of slit structures is disposed parallel to, or on a straight line together with, at least one adjacent slit structure.

5. The electronic device of claim 1, wherein the slit structure includes the first portion extending in the first direction, the second portion formed at the first end of the first portion, and a third portion formed at a second end of the first portion opposite the first end.

6. The electronic device of claim 5, wherein at least one of the second portion and the third portion comprises a circular hole shape with a designated diameter.

7. The electronic device of claim 5, wherein at least one of the second portion and the third portion comprises a semi-circular hole shape with a designated diameter.

8. The electronic device of claim 5, wherein the second portion extends in a second direction inclined from the first direction, and wherein the third portion extends in a third direction inclined from the first direction.

9. The electronic device of claim 8, wherein the second direction and the third direction are directions inclined to face in opposite directions with respect to the first direction.

10. The electronic device of claim 1, further comprising an elastic member stacked on a surface of the heat dissipation sheet.

11. The electronic device of claim 10, wherein the elastic member is stacked on a surface of the bending area of the heat dissipation sheet.

12. The electronic device of claim 10, wherein at least a portion of the elastic member is disposed between the display and the heat dissipation sheet.

13. The electronic device of claim 1, further comprising a supporting member coupled to a surface of the heat dissipation sheet.

14. The electronic device of claim 13, wherein the supporting member includes at least a portion configured to support the display.

15. The electronic device of claim 13, wherein at least a portion of the heat dissipation sheet is disposed between the display and the supporting member.

16. An electronic device comprising:

a housing including a first housing and a second housing providing a motion relative to the first housing;

a hinge structure connecting the first housing and the second housing to pivot from a folded state to an unfolded state;

a flexible display formed to be transformed in response to the motion of the first housing relative to the second housing and including a first display area disposed on the first housing, a second display area disposed on the second housing, and a folding area connecting the first display area and the second display area;

an electrical component disposed in the housing;

a heat dissipation sheet comprising a graphite sheet configured to receive heat generated from the electrical component and including a first fixed area facing the first display area, a second fixed area facing the second display area, and a bending area facing the folding area; and a slit structure comprising a slit shape penetrating upper and lower surfaces of the bending area, the slit structure formed in at least a portion of the bending area and including at least a first portion extending along a first direction parallel to, or forming an acute angle with, the folding area and a second portion formed at a first end of the first portion, the second portion comprising one of a circular hole shape with a designated diameter penetrating the upper and lower surfaces of the bending area and a curved shape penetrating the upper and lower surfaces of the bending area.

17. The electronic device of claim 16, further comprising an elastic member stacked on a surface of the heat dissipation sheet.

18. The electronic device of claim 16, further comprising a supporting member stacked on a surface of the heat dissipation sheet.

19. The electronic device of claim 16, wherein the slit structure includes the first portion extending in the first direction, the second portion formed at the first end of the first portion, and a third portion formed at a second end of the first portion opposite the first end.

20. The electronic device of claim 16, wherein the electronic device includes a plurality of slit structures, and wherein any one of the plurality of slit structures is disposed parallel to, or on a straight line together with, at least one adjacent slit structure.

* * * * *